United States Patent
Wu et al.

(10) Patent No.: US 12,406,848 B2
(45) Date of Patent: Sep. 2, 2025

(54) METHOD OF FABRICATING A GATE CUT FEATURE FOR MULTI-GATE SEMICONDUCTOR DEVICES

(71) Applicant: Taiwan Semiconductor Manufacturing Company, Ltd., Hsin-Chu (TW)

(72) Inventors: Ming-Yuan Wu, Hsinchu (TW); Da-Wen Lin, Hsinchu (TW); Yi-Ting Fu, Hsinchu (TW); Hsu-Chieh Cheng, Hsinchu (TW); Min Jiao, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 505 days.

(21) Appl. No.: 17/736,898

(22) Filed: May 4, 2022

(65) Prior Publication Data

US 2023/0015372 A1    Jan. 19, 2023

Related U.S. Application Data

(60) Provisional application No. 63/222,538, filed on Jul. 16, 2021.

(51) Int. Cl.
*H01L 21/28* (2025.01)
*H01L 21/02* (2006.01)
*H10D 30/01* (2025.01)
*H10D 30/67* (2025.01)
(Continued)

(52) U.S. Cl.
CPC .... *H01L 21/28123* (2013.01); *H01L 21/0259* (2013.01); *H10D 30/031* (2025.01);
(Continued)

(58) Field of Classification Search
CPC ........... H01L 29/42392; H01L 29/6645; H01L 29/66439; H01L 29/78696; H01L 29/0665;
(Continued)

(56) References Cited

U.S. PATENT DOCUMENTS 8,772,109 B2   7/2014   Colinge
8,785,285 B2   7/2014   Tsai et al.
(Continued)

FOREIGN PATENT DOCUMENTS

TW         202117855 A     5/2021

*Primary Examiner* — Alonzo Chambliss
(74) *Attorney, Agent, or Firm* — HAYNES AND BOONE, LLP

(57) ABSTRACT

A method includes forming a fin protruding from a substrate, forming a first dielectric feature adjacent to the fin over the substrate, forming a cladding layer over the fin and the first dielectric feature, and removing a portion of the cladding layer to form an opening. The opening exposes the first dielectric feature. The method further includes forming a second dielectric feature adjacent to the cladding layer, the second dielectric feature filling the opening, forming a dummy gate stack over the fin and the second dielectric feature, forming source/drain (S/D) features in the fin adjacent to the dummy gate stack, and replacing the dummy gate stack and the cladding layer with a metal gate stack. The second dielectric feature divides the metal gate stack.

20 Claims, 17 Drawing Sheets

(51) Int. Cl.
  *H10D 62/10* (2025.01)
  *H10D 64/01* (2025.01)
  *H10D 84/01* (2025.01)
  *H10D 84/03* (2025.01)
  *H10D 84/83* (2025.01)

(52) U.S. Cl.
  CPC ..... *H10D 30/6735* (2025.01); *H10D 30/6757* (2025.01); *H10D 62/118* (2025.01); *H10D 64/017* (2025.01); *H10D 84/0128* (2025.01); *H10D 84/0151* (2025.01); *H10D 84/038* (2025.01); *H10D 84/83* (2025.01)

(58) Field of Classification Search
  CPC ....... H01L 29/66742; H01L 21/823481; H01L 21/28123; H01L 21/0259; H01L 21/823412; H01L 27/088
  See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 2020/0006075 | A1 | 1/2020 | Wang et al. |
| 2021/0234017 | A1* | 7/2021 | Yao .................. H01L 21/02603 |
| 2022/0310783 | A1* | 9/2022 | Chen .................... H01L 29/0653 |
| 2022/0406900 | A1* | 12/2022 | Wu .................... H01L 29/66439 |

* cited by examiner

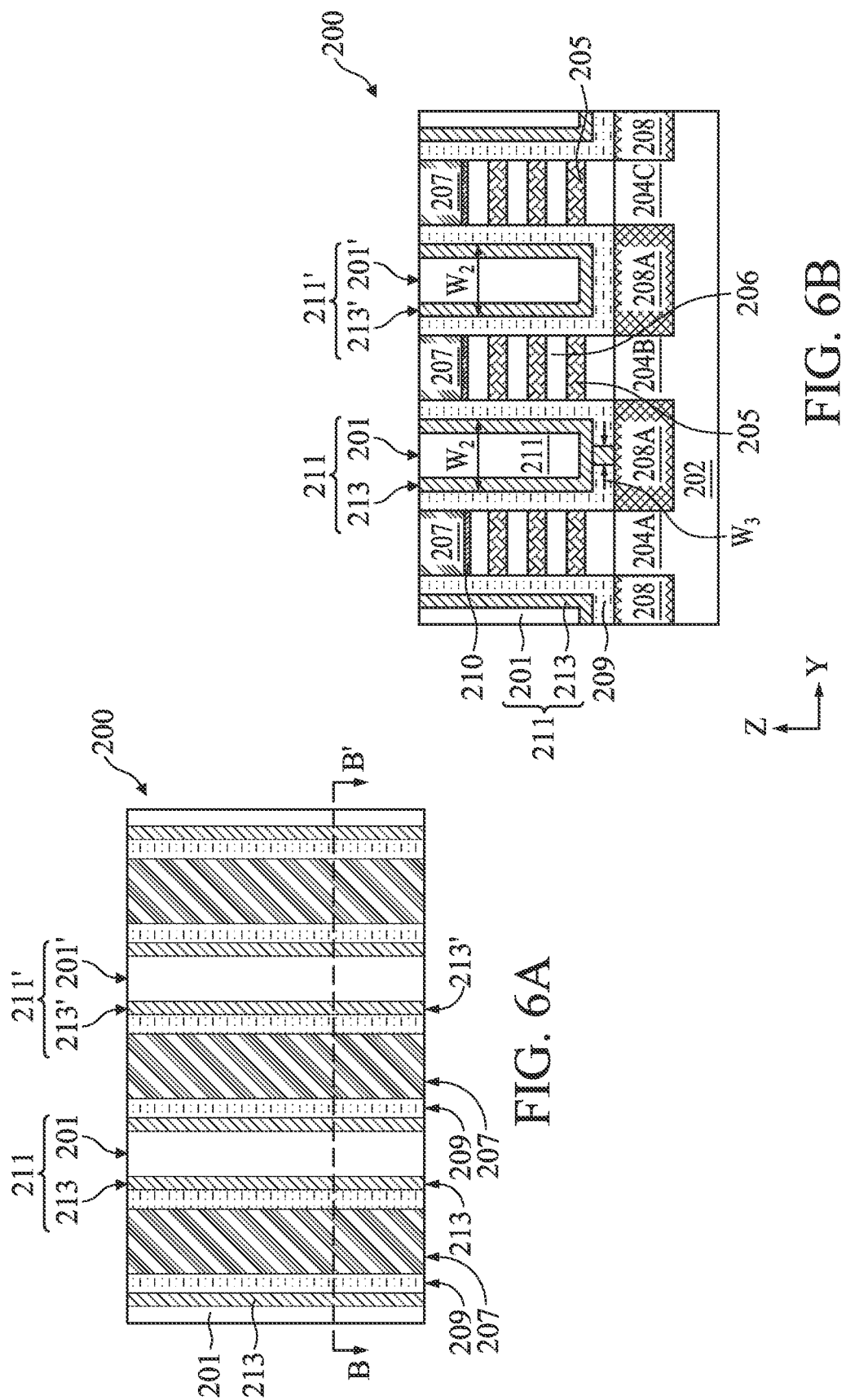

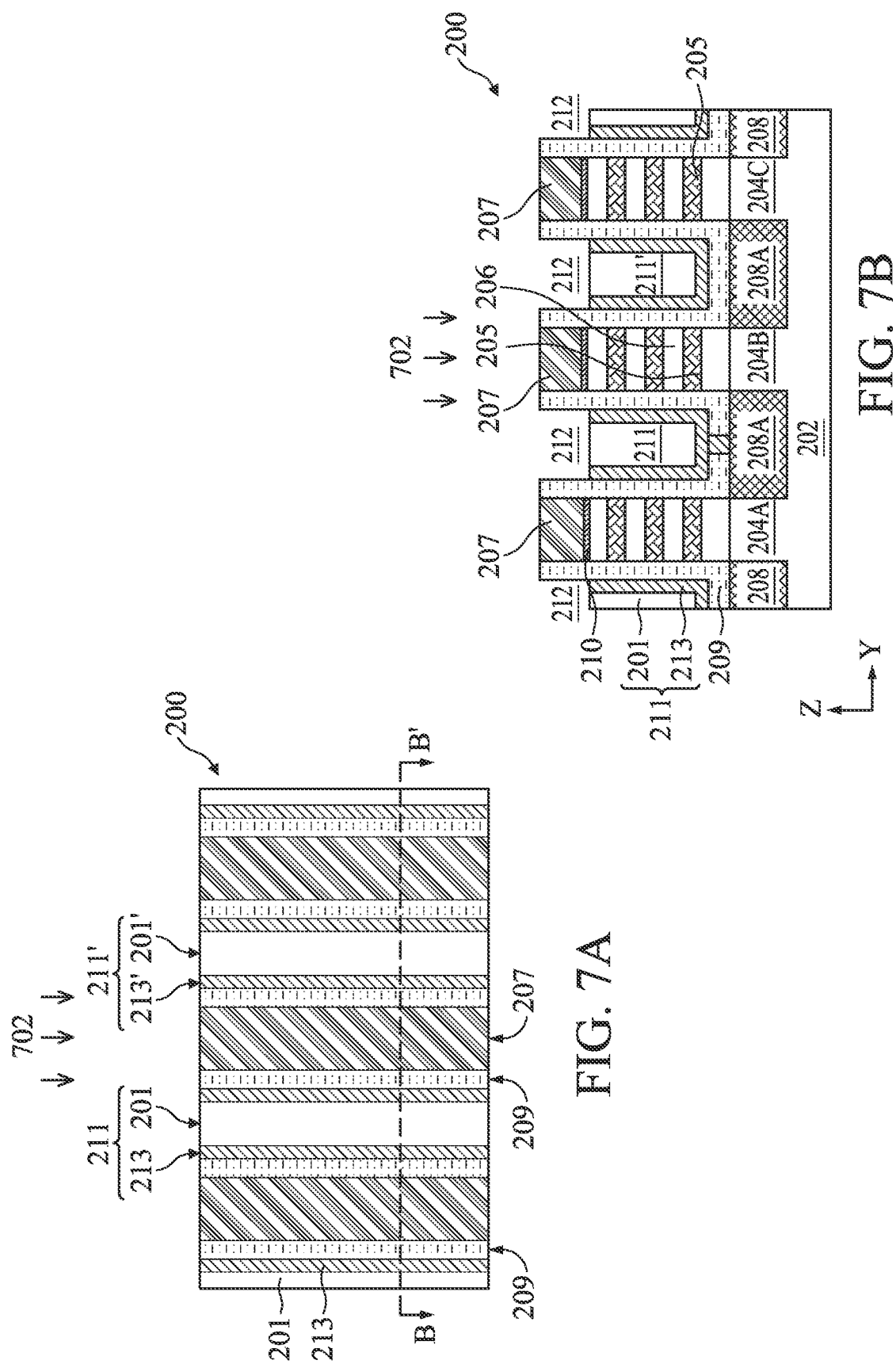

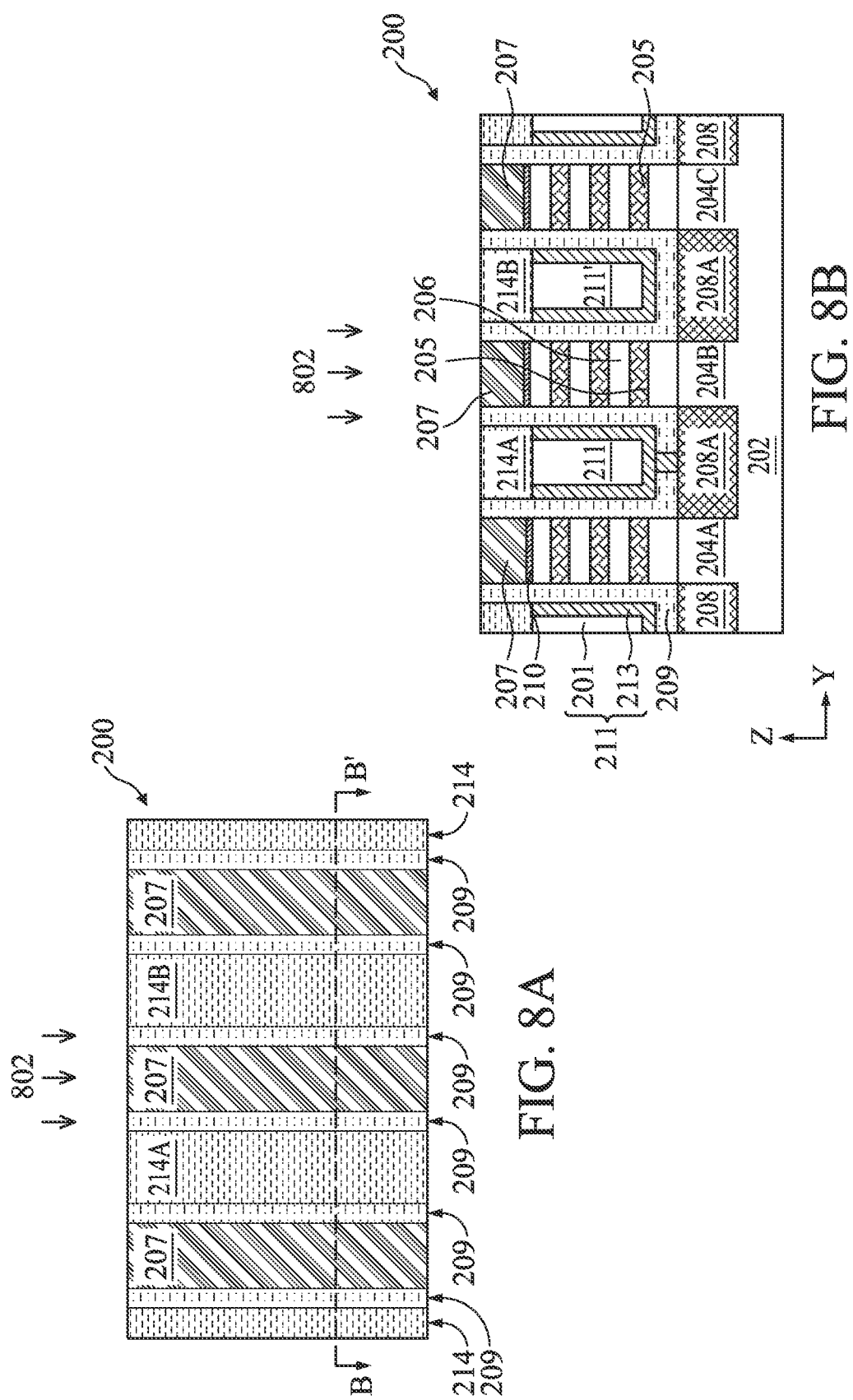

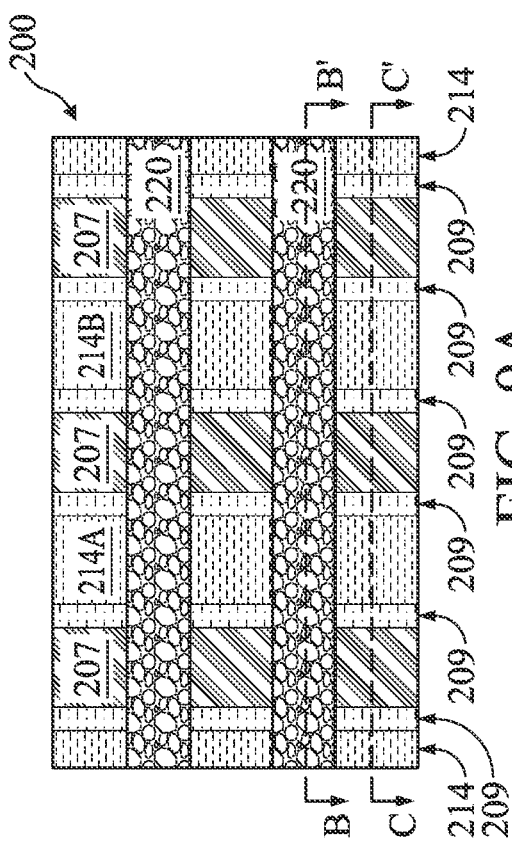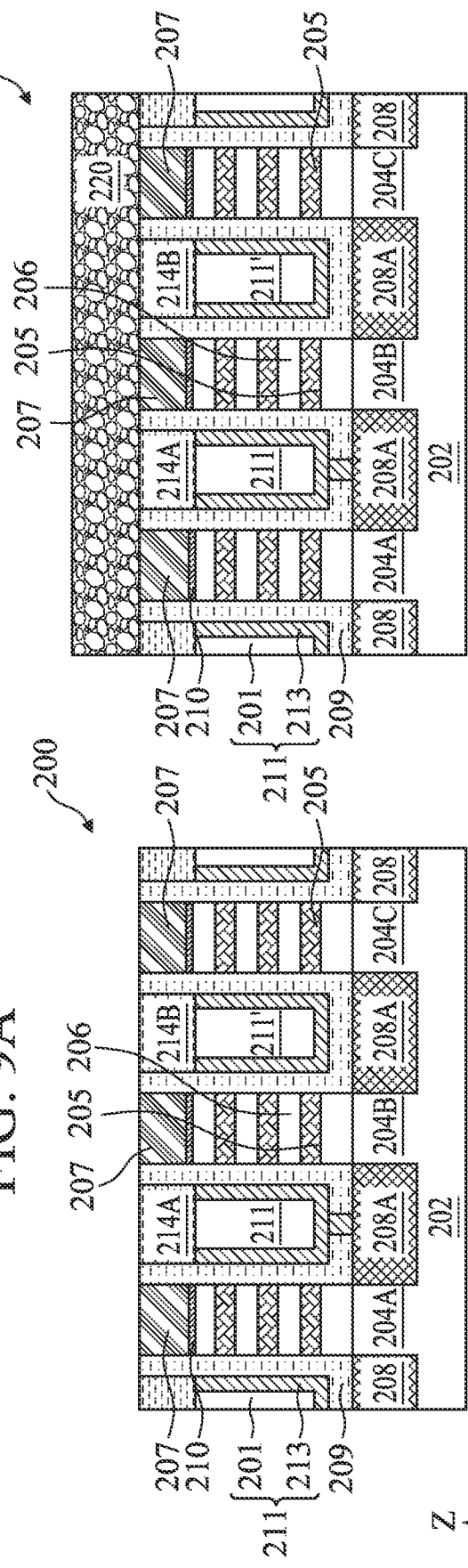
FIG. 9A
FIG. 9B
FIG. 9C

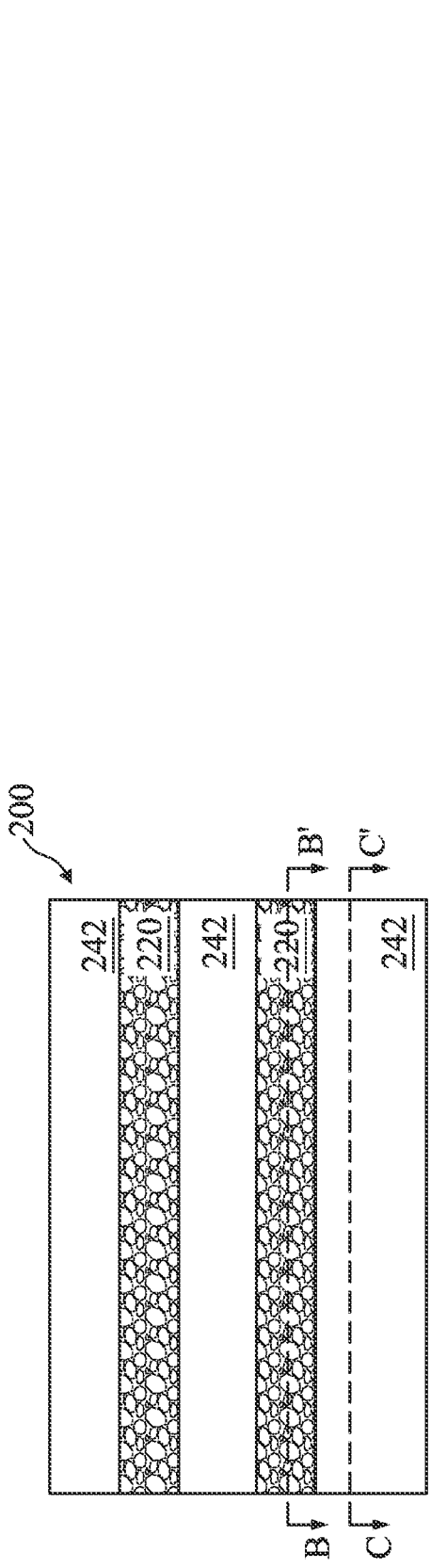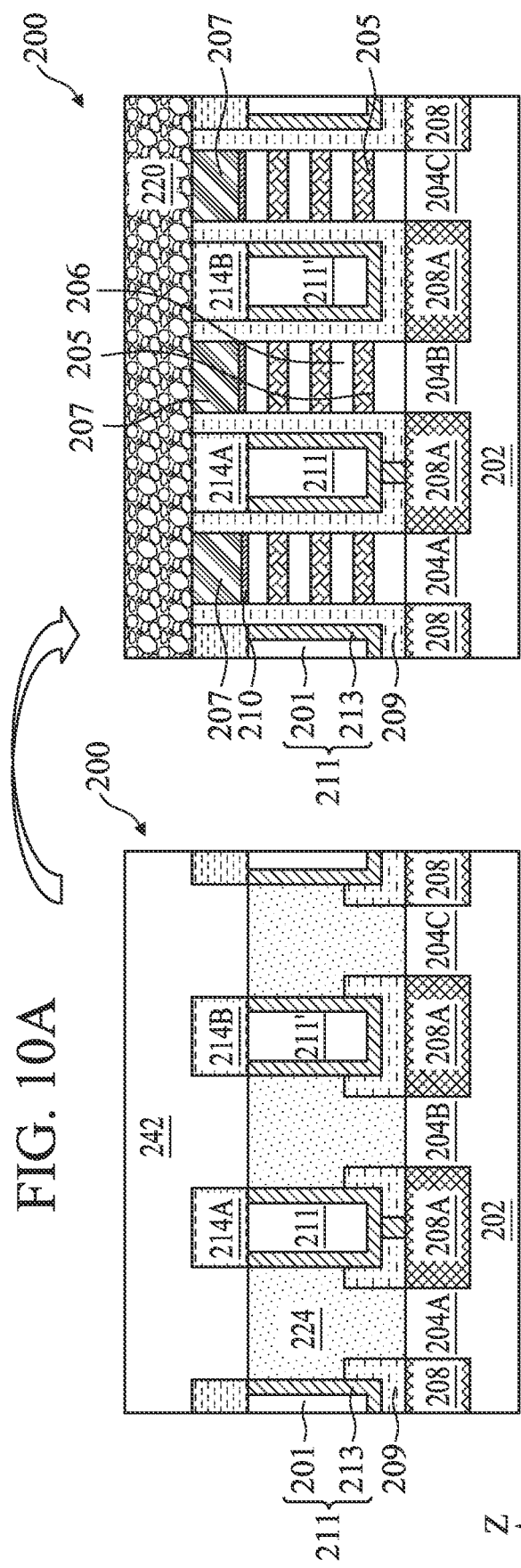
FIG. 10A
FIG. 10B
FIG. 10C

METHOD OF FABRICATING A GATE CUT FEATURE FOR MULTI-GATE SEMICONDUCTOR DEVICES

PRIORITY DATA

This application claims priority to U.S. Provisional Patent Application No. 63/222,538 filed on Jul. 16, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, the size of the gate cut feature is reduced accordingly to achieve the design dimensions. While methods of fabricating the gate cut feature have been generally adequate for their intended purposes, they have not been entirely satisfactory in all aspects. For example, multiple layers of different materials need to be removed when forming a trench for the gate cut feature, which requires multiple etching processes. In addition, the low aspect ratio of the trench in smaller technology nodes lead to difficulties during the filling of the gate cut feature in the trench, such as incomplete filling caused by trapped air bubbles. It is a need to improve the gate cut feature and the method of fabricating the same.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 5A-1, 6A, 7A, 8A, 9A, 10A, 11A, 12A, 13A, and 14A are planar top views of the semiconductor device as shown in FIGS. 2A and/or 2B during intermediate stages of the method shown in FIG. 1 according to various embodiments of the present disclosure.

FIGS. 3B, 4B, 5B, 5B-1, 6B, 6B-1, 7B, 8B, 9B, 10B, 11B, 12B, 13B, and 14B are cross-sectional views of the semiconductor device taken along line BB' as shown in FIGS. 2A and/or 2B during intermediate stages of the method shown in FIG. 1 according to various embodiments of the present disclosure.

FIGS. 9C, 10C, 11C, 12C, 13C, 14C, and 14C-1 are cross-sectional views of the semiconductor device taken along line CC' as shown in FIGS. 2A and/or 2B during intermediate stages of the method shown in FIG. 1 according to various embodiments of the present disclosure.

DETAILED DESCRIPTION

Figure 1:
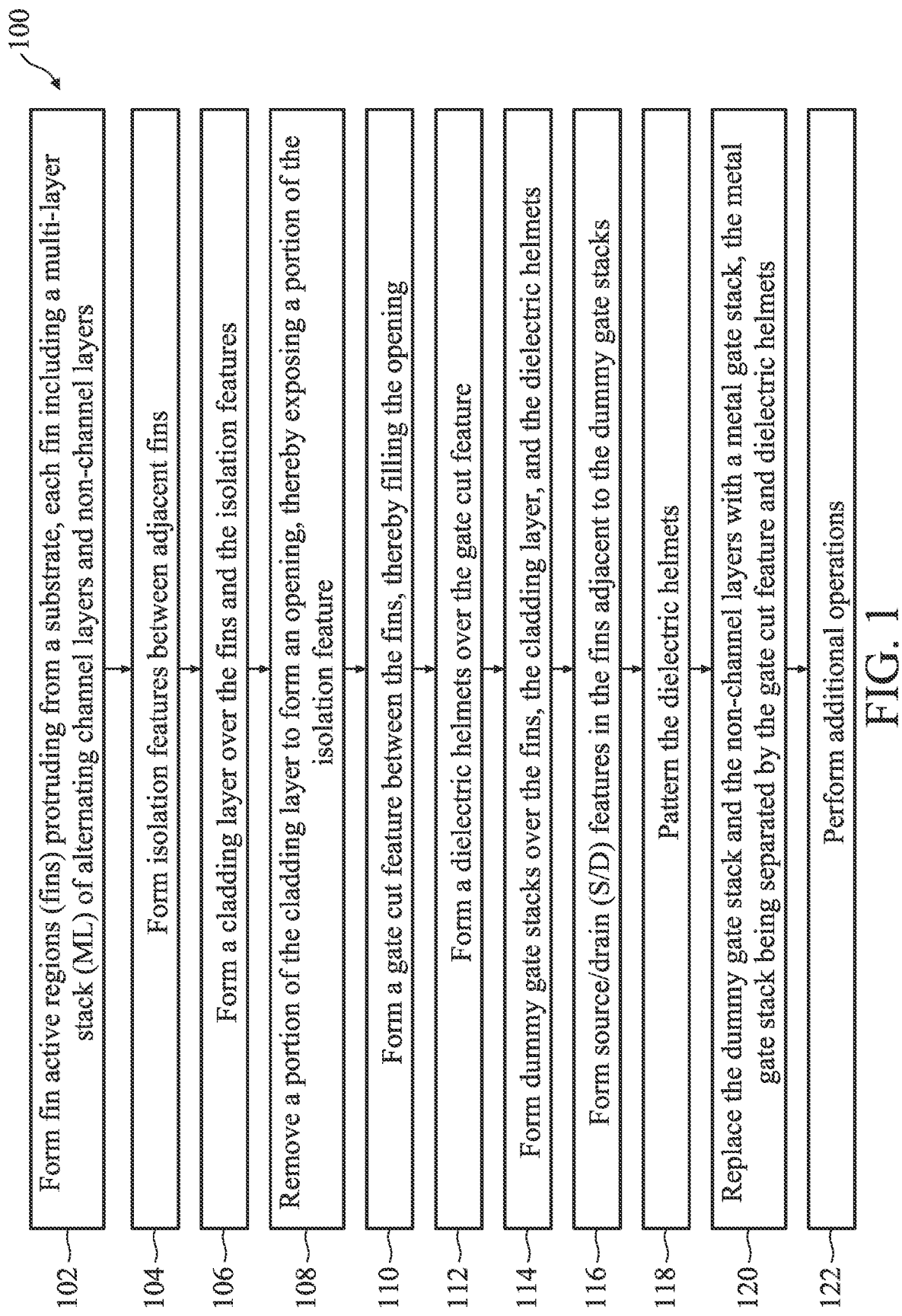
FIG. 1 illustrates a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nanometers" encompasses the dimension range from 4.5 nanometers to 5.5 nanometers. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional nanostructure (NS) FETs (alternatively referred to as gate-all-around, or GAA FETs), in memory and/or standard logic cells of an integrated circuit (IC) structure. Generally, an NS FET includes a plurality of active regions formed by vertically stacked nanosheets, source/drain (S/D) features disposed in the NS FET, and metal gate stacks disposed adjacent to the S/D features and interleaving with the nanosheets. In such configuration, the metal gate stacks are truncated (or cut, separated) by gate cut features to control various active regions according to design requirements. However, in some instances, the forming of the gate cut feature are complex and troublesome when the size of the IC structure becomes smaller. For example, the forming of the trench for gate cut feature requires multiple etching processes to remove different layers of materials. In addition, the low aspect ratio (a width along Y direction: a length along Z direction) of the trench may cause air bubbles and incomplete filling of the gate cut feature in the trench. The present embodiments solve the aforementioned issues. The present disclosure includes multiple embodiments. Different embodiments may have different advantages, and no particular advantage is necessarily required of any embodiment.

Figure 2B:
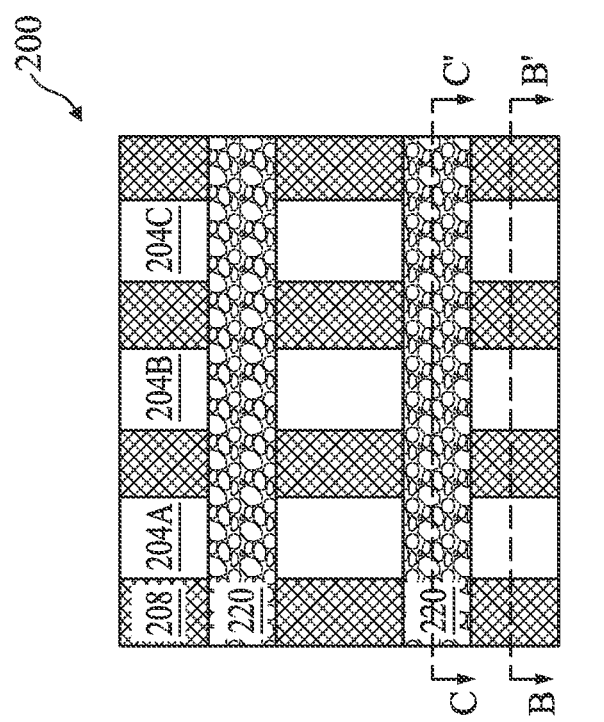
FIG. 2B is a planar top view of the semiconductor device shown in FIG. 2A according to various embodiments of the present disclosure.
Figure 2A:
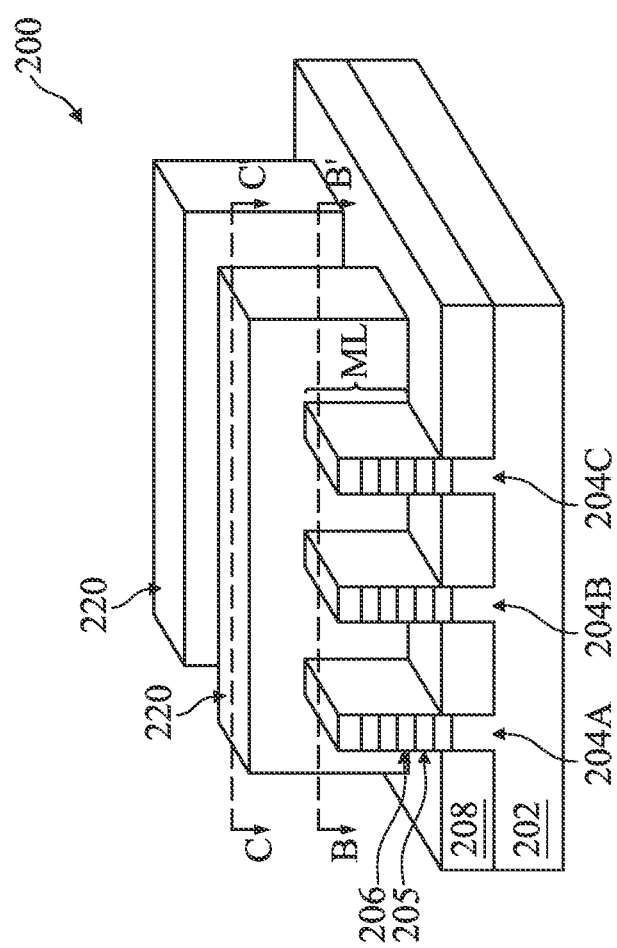
FIG. 2A is a three-dimensional perspective view of a portion of an example semiconductor device according to various embodiments of the present disclosure.

Referring now to FIG. 1, a flowchart of a method 100 of forming a semiconductor device 200 (hereafter simply referred to as the device 200) is illustrated according to various aspects of the present disclosure. The method 100 is merely an example and not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 3A to 14C-1, which are various top planar views and cross-sectional of the device 200 as shown in FIGS. 2A and 2B at intermediate steps of the method 100. For examples, 3A, 4A, 5A, 5A-1, 6A, 7A, 8A, 9A, 10A, 11A, 12A, 13A, and 14A are planar top views of the device 200 as shown in FIGS. 2A and/or 2B; FIGS. 3B, 4B, 5B, 5B-1, 6B, 6B-1, 7B, 8B, 9B, 10B, 11B, 12B, 13B, and 14B are cross-sectional views of the device 200 taken along line BB' as shown in FIGS. 2A and/or 2B; and FIGS. 9C, 10C, 11C, 12C, 13C, 14C, and 14C-1 are cross-sectional views of the device 200 taken along line CC' as shown in FIGS. 2A and/or 2B.

The device 200 may be an intermediate device fabricated during processing of an IC, or a portion thereof, that may comprise static random-access memory (SRAM) and/or other logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the device 200 includes one or more NS FETs. The present disclosure is not limited to any particular number of devices or device regions, or to any particular device configurations. Additional features can be added to the device 200, and some of the features described below can be replaced, modified, or eliminated in other embodiments of the device 200.

At operations 102 and 104, referring to FIGS. 2A, 2B, 3A, and 3B, the method 100 forms the device 200 that includes multiple three-dimensional fin active regions (hereafter referred to as fins) 204 protruding from a semiconductor substrate (hereafter referred to as the substrate) 202, where the fins 204 are separated by isolation features (or dielectric feature) 208. Each portions of the isolation features 208 is defined by a width $w_1$ that equals to a distance between two adjacent fins 204, where $w_1$ is about 30 nm to about 50 nm. Portions of the fins 204 are denoted to as 204A, 204B, and 204C, portions of the isolation features 208 are denoted as 208A (between fins 204A and 204B) and 208B (between fins 204B and 204C) for clarity and simplicity in the present disclosure. The denotations of the fins 204 and the isolation features 208, by themselves, do not indicate any differences therebetween.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

Figures 3A, 3B:
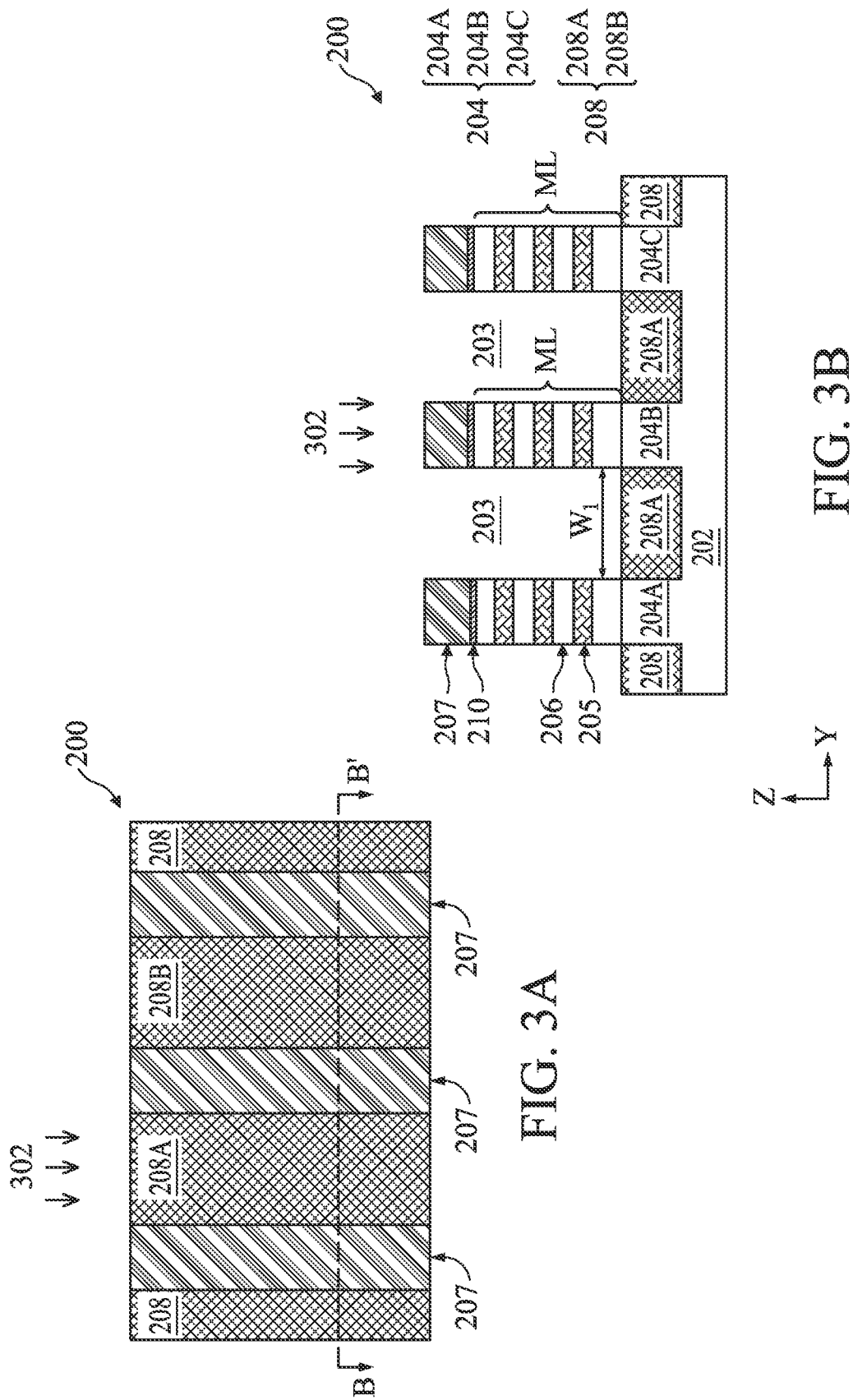

In the present embodiments, still referring to FIGS. 2A, and 3B, each fin 204 (including the fins 204A, 204B, and 204C) includes a multi-layer structure (ML) of alternating non-channel layers (or sacrificial layers) 205 and channel layers 206 stacked vertically over the substrate 202. A hard mask 207 may be formed over the ML. In some embodiments, the hard mask layer 207 has a composition the same as or similar to the non-channel layer 205. In some embodiments, an oxide layer 210 may be optionally formed between the hard mask 207 and the topmost channel layer 206.

In the present embodiments, the non-channel layers 205 are sacrificial layers configured to be removed at a subsequent processing step, thereby providing openings between the channel layers 206 for forming the metal gate stack therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, the channel layer 206 may include elemental Si and the non-channel layer 205 may include SiGe. In another example, the channel layers 206 may include elemental Si and the non-channel layers 205 may include elemental Ge. In the present embodiments, the channel layers 206 include elemental Si and the non-channel layers 205 include SiGe. In some examples, each fin 204 may include a total of three to ten pairs of alternating non-channel layers 205 and channel layers 206; of course, other configurations may also be applicable depending upon specific design requirements.

In the present embodiments, forming the ML includes alternatingly growing the non-channel layers 205 and the channel layers 206 in a series of epitaxy processes. The epitaxy processes may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interact with the composition of the underlying substrate, e.g., the substrate 202. In some examples, the non-channel layers 205 and the channel layers 206 may be formed into nanosheets, nanowires, or nanorods. A sheet (or wire) release process may then be implemented to remove the non-channel layers 205 to form openings between the channel layers 206, and a metal gate stack is subsequently formed in the openings, thereby providing an NS FET.

In the present embodiments, the fins 204 are fabricated from the ML using a series of photolithography and etching processes. For example, the photolithography process may include forming a photoresist layer overlying the ML, exposing the photoresist layer to a pattern, performing post-exposure bake processes, and developing the exposed photoresist layer to form a patterned masking element (not depicted). The ML is then etched using the patterned masking element as an etch mask, thereby leaving the fins 204A, 204B, and 204C protruding the substrate 202 and separated by trenches 203. The etching process may include dry etching, wet etching, reactive ion etching (RIE), other suitable processes, or combinations thereof. The patterned masking element is subsequently removed from the ML using any suitable process, such as ashing and/or resist stripping.

In some embodiments, the hard mask 207 is configured to protect the fins 204 (including the fins 204A, 204B, and 204C) during subsequent processing steps and is later removed from the device 200. In some embodiments, the hard mask 207 has a composition similar to or the same as that of the non-channel layers 205 and includes, for example, SiGe. In some embodiments, the optional oxide layer 210 includes any suitable materials, such as silicon oxide ($SiO_x$, $1 \leq x \leq 2$). In some embodiments, the hard mask 207 and the oxide layer 210 are collectively patterned with the ML during the fin fabrication process.

The isolation features 208 (including the isolation features 208A and 208B) may include silicon oxide ($SiO_x$, $1 \leq x \leq 2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. In one embodiment, the isolation features 208 are formed by filling trenches 203 between the fins 204 with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation features 208. In some embodiments, the isolation features 208 include shallow trench isolation (STI) features. In some embodiments, the isolation features 208 include a single-layer structure or a multi-layer structure. As depicted in FIG. 3B, top surfaces of the isolation features 208 are exposed in the trenches 203.

Figures 4A, 4B:
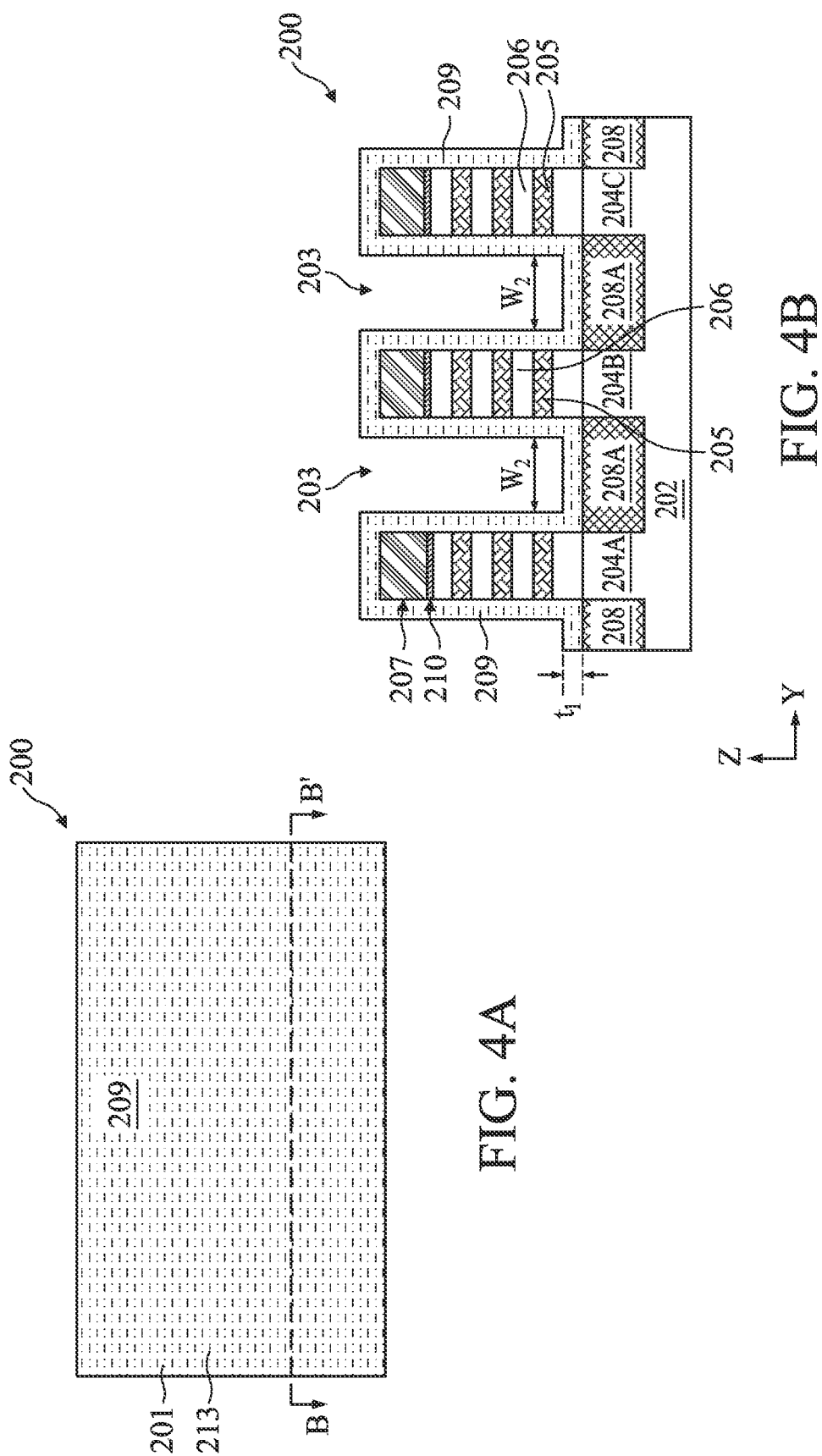

At operation 106, referring to FIGS. 4A and 4B, the method 100 forms a cladding layer 209 along sidewalls of the fins 204 and over the isolation features 208. In some embodiments, the cladding layer 209 has a composition that is similar to that of the non-channel layers 205, such that the cladding layer 209 and the non-channel layers 205 can be removed together. In one example, the cladding layer 209 and the non-channel layers 205 both include silicon germanium (SiGe) but different in germanium concentrations, such as the cladding layer 209 may have a higher molar ratio of germanium. In some embodiments, the cladding layer 209 is deposited epitaxially by a suitable method discussed above with respect to forming the ML. In alternative embodiments, the cladding layer 209 is deposited conformally, rather than grown epitaxially, over surfaces of the device 200 as an amorphous layer, such that the cladding layer 209 is also formed over the isolation features 208. In the present embodiments, the cladding layer 209 is formed to a thickness ti ranges from about 5 nm to about 10 nm. The cladding layer 209 partially fills the trenches 203. Each trench 203 has a width $w_2$ between two adjacent fins 204 after the deposition of the cladding layer 209, where the width $w_2$ is about 10 nm to about 40 nm.

Generally, the gate cut feature is formed after the forming of the dummy gate stacks or after the forming of the metal gate stacks. In these cases, trenches are formed by removing portions of the dummy gate stack or the metal gate stacks, the layers (e.g., the interlayer dielectric (ILD) layer disposed thereover, the isolation features between the fins, and/or the substrate. The gate cut features are then formed in the trenches by filling proper materials. However, the forming of the trenches requires to remove multilayers of different materials, which may involve multiple complex etching processes. In addition, the aspect ratios of the trenches become higher as the scaling down of the IC device. The low aspect ratio may cause issues during the forming of the gate cut feature therein. For example, air bubbles may be trapped in the trench and lead to incomplete filling of the trench. The embodiments of the present disclosure solve these issues. For example, the present embodiments forms gate cut features with a low aspect ratio before the forming of the dummy gate stacks, thereby avoiding multiple etching processes. The gate cut features are disposed between fins and contact the isolation features through an opening in the cladding layer of the fins. Detail of the present embodiments is explained below with respect to FIG. 1 and FIG. 5A to FIG. 14C-1.

Figures 5A, 5B:
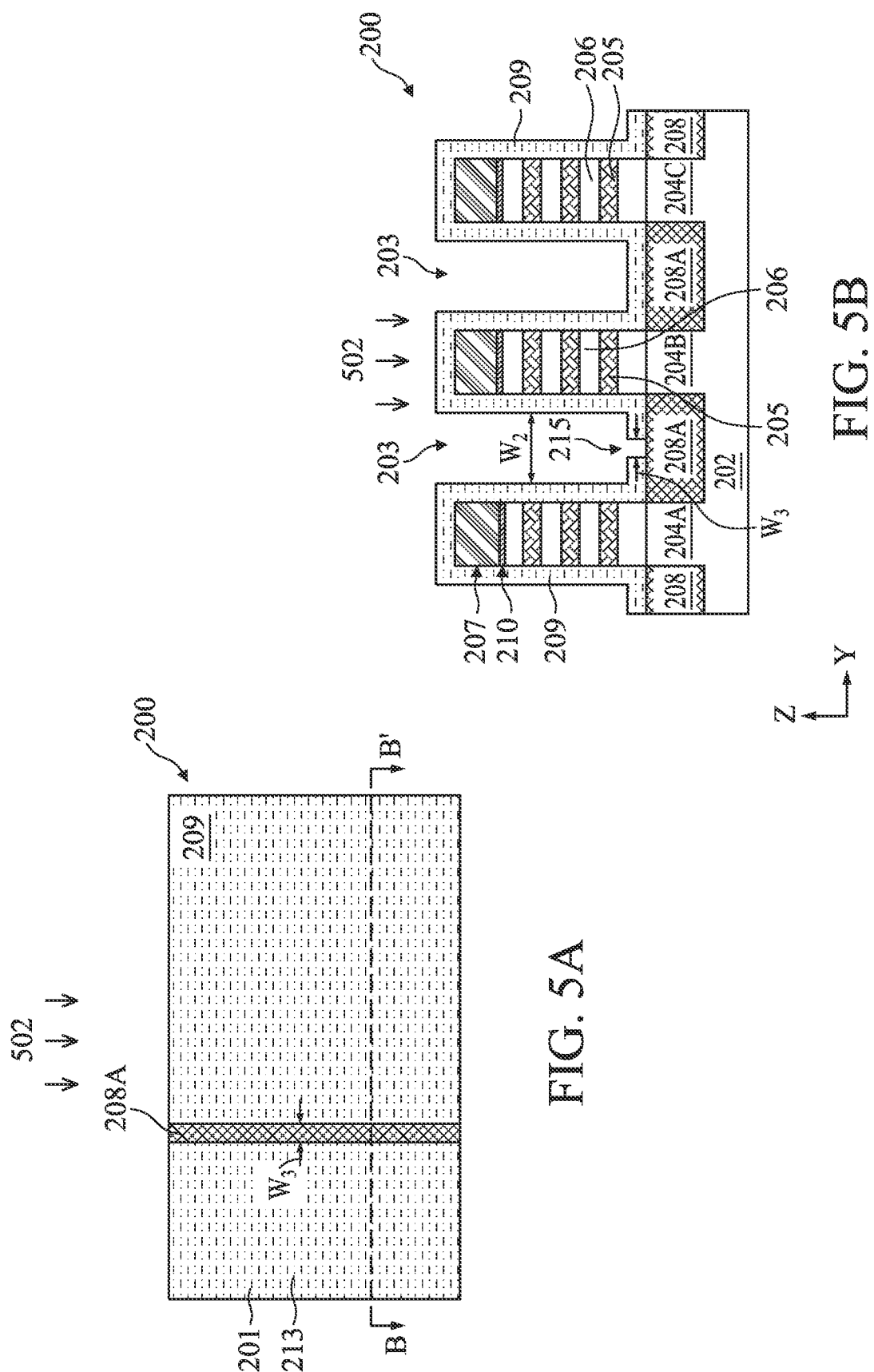
Figures 1, 5A, 5B:
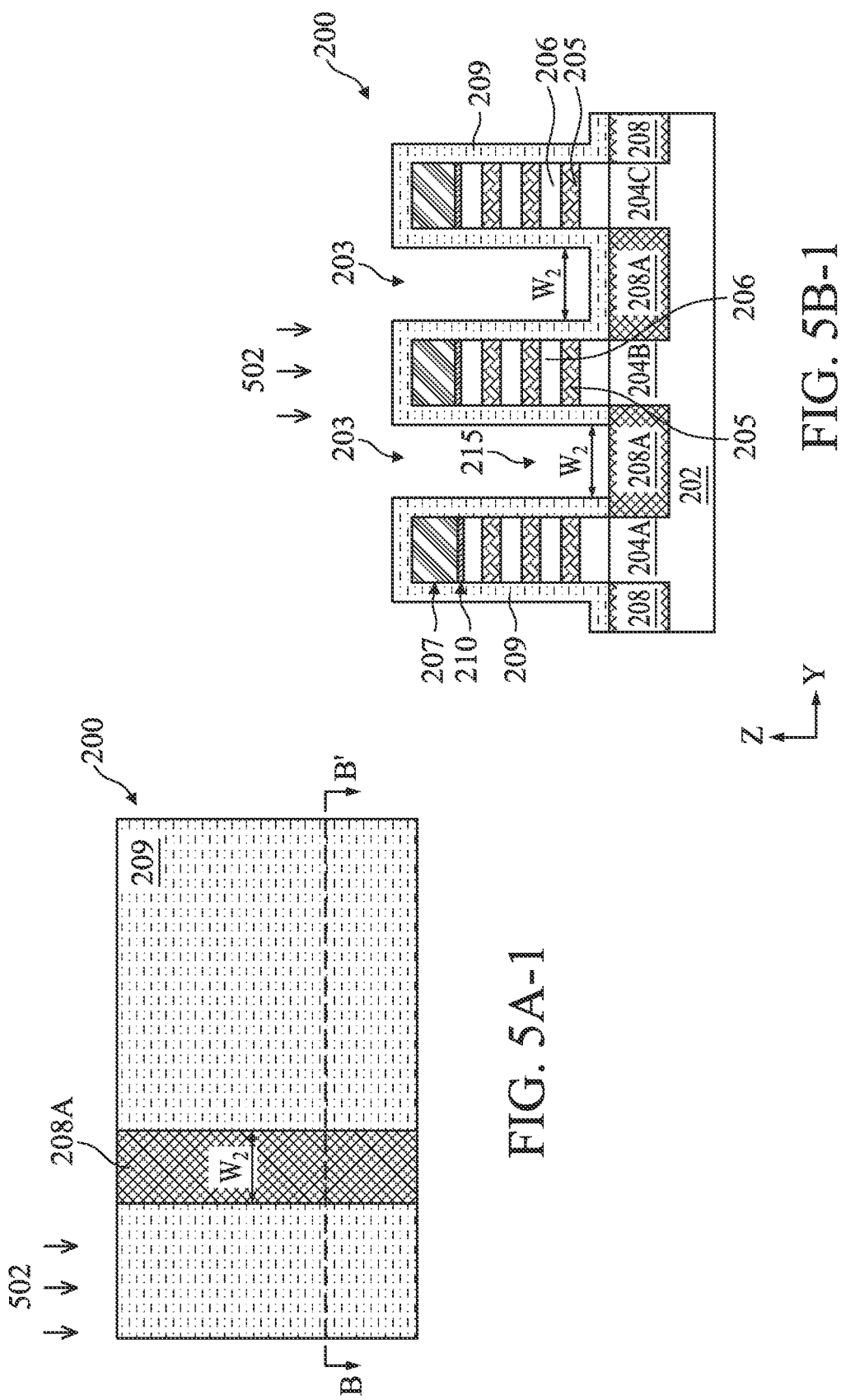

At operation 108, referring to FIGS. 5A and 5B, the method 100 performs an etching process 502 to selectively remove portions of the cladding layer 209 between the fins 204A and 204B, thereby forming an opening 215 and exposing portions of the isolation features 208A. The isolation features 208A, the vertical portions of the cladding layer 209, and the horizontal portion of the cladding layer 209 disposed over the fins 204 (or the hard mask 207 if present) remain intact or substantially intact. The isolation feature 208B remains covered under the cladding layer 209. The opening 215 separates (or truncates, divides, cuts) the cladding layer 209 into a first portion over the fin 204A and a second portion over the fins 204B and 204C. In some embodiments, the etching process 502 includes a dry etching process, an RIE process, or combinations thereof. In some embodiments, a photolithography may be used to remove the portions of the cladding layer 209.

As depicted in FIGS. 5A and 5B, the etching process removes a portion of the horizontal portion of the cladding layer 209 defined by a width $w_3$, where the width $w_3$ is about 1 to about 2 times of the thickness ti to ensure the aspect ratio of the opening 215 is suitable for filling dielectric materials therein as explained in detail below. Each of the trenches 203 is defined by the width $w_2$ at a top portion and a width $w_3$ at the bottom portion. In some embodiments, the width $w_3$ is greater than 80% of the width $w_2$ but less than $w_2$. If the width $w_3$ is less than xx %, the gate cut feature formed in subsequent processes may not land stably on the isolation feature 208A. In one example, the width $w_3$ ranges from about 20 nm to about 30 nm. Remaining portions of the cladding layer 209 forms a L shape or a reverse L shape over the isolation feature 208A and the sidewalls of the fins 204A and 204B, respectively.

FIGS. 5A-1 and 5B-1 depict alternative embodiments of these depicted in FIGS. 5A and 5B, where the etching process 502 removes the entire horizontal portion of the cladding layer 209 over the isolation feature 208A, thereby enabling further reduction in sizes of the device 200. In this case, the width $w_3$ equals to the width $w_2$. The trench 203 has a uniform width $w_2$ throughout the entire length of the trench 203 along Z direction.

Figures 1, 6B:
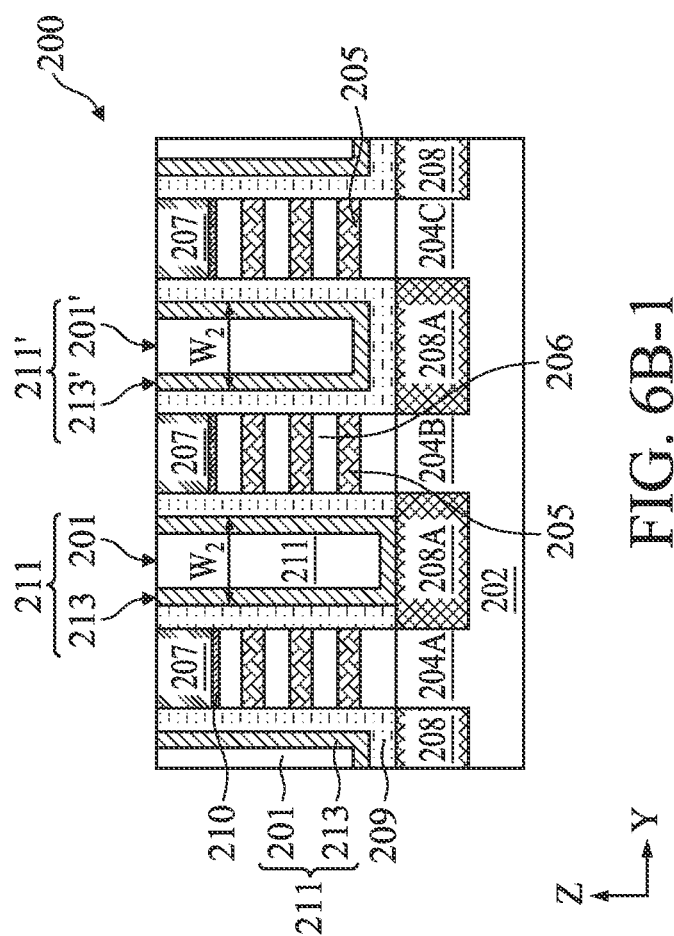

At operation 110, referring to FIGS. 6A and 6B, the method 100 forms a gate cut feature (or dielectric feature) 211 in one of the trenches 203 between the fins 204A and 204B, thereby completely filling the opening 215 and the trench 203. The gate cut feature 211 is configured to truncate (or isolate, separate, cut) the metal gate stack formed in subsequent processes explained in detail below. A bottom surface of the gate cut feature 211 contacts a top surface of the isolation feature 208A.

In the embodiment depicted in FIG. 6B, the gate cut feature 211 includes a top portion defined by the width $w_2$ and a bottom portion defined by the width $w_3$. The bottom portion is formed in the opening 215 and cuts the cladding layer 209 (and thereby the later formed metal gate stack). FIG. 6B-1 depicts an alternative embodiment of that depicted in FIG. 6B, where the gate cut feature 211 is defined by the width $w_2$ throughout the entire length along Z direction. FIG. 6B corresponds to the embodiment depicted in FIG. 5B, and FIG. 6B-1 corresponds to the embodiment depicted in FIG. 5B-1. Both the embodiments depicted in FIGS. 6B and 6B-1 undergo the same process hereafter, therefore the embodiments depicted in FIG. 6B is used as an example to illustrate the operations of the method 100 and the related embodiments.

The gate cut feature 211 may include any suitable material, such as silicon oxide ($SiO_x$, $1 \leq x \leq 2$), silicon nitride (SiN), silicon carbide (SiC), oxygen-containing silicon nitride (SiON), oxygen-containing silicon carbide (SiOC), carbon-containing silicon nitride (SiCN), aluminum oxide ($Al_2O_3$), tetraethylorthosilicate (TEOS), doped silicon oxide (e.g., borophosphosilicate glass (BPSG), FSG, phosphosilicate glass (PSG), boron-doped silicate glass (BSG), etc.), a high-k dielectric material (having a k value greater than that of silicon oxide, which is about 3.9), other suitable materials, or combinations thereof. The high-k dielectric material may include oxygen, lanthanum, aluminum, titanium, zirconium, tantalum, other suitable materials, or combinations thereof. For example, the high-k dielectric material may include hafnium oxide ($HfO_2$), lanthanum oxide ($La_2O_3$), other high-k oxide materials, or combinations thereof. In the present embodiments, the gate cut feature 211 includes a material that is the same as a material included in the isolation feature 208. In one such embodiment, the gate cut feature 211 includes silicon oxide.

The gate cut feature 211 may be single-layered or multi-layered. In some embodiments, the gate cut feature 211 each include a lining layer 213 and a filling layer 201 different from the lining layer 213 in composition. In some embodiments, the lining layer 213 has a higher density than that of the filling layer 201. In some embodiments, the filing layer 201 has a lower dielectric constant than the lining layer 213. In some embodiments, the lining layer 213 is formed conformally along sidewalls of the cladding layer 209 and over the isolation features 208A prior to the deposition of the filling layer 201. The lining layer 213 may be formed by any suitable method, such as ALD, CVD, other suitable methods, or combinations thereof. The filling layer 201 is subsequently formed over the lining layer 213 by any suitable method, such as CVD, FCVD, other suitable methods, or combinations thereof. In some embodiments, the device 200 is subsequently planarized by one or more CMP process to expose a top surface of the hard mask 207.

The dummy gate cut feature (or dielectric feature) 211' is formed as a byproduct in the same process that forms the gate cut feature 211. The dummy gate cut feature 211' does not truncate, or completely truncate, the metal gate stack formed in subsequent processes. However, additional patterning processes are required to avoid the forming of the dummy gate cut feature 211' during the forming of the gate cut feature 211. In the present embodiments, a top surface of the dummy gate cut feature 211' is coplanar with a top surface of the gate cut feature 211, while a bottom surface of the dummy gate cut feature 211' is above a bottom surface gate cut feature 211. The dummy gate cut feature 211' is separated from the isolation feature 208B by the cladding layer 209. The cladding layer 209 is continuous between the dummy gate cut feature 211' and the isolation feature 208B. The dummy gate cut feature 211' is defined by the width $w_2$ throughout the entire length along Z direction.

The dummy gate cut feature 211' includes the same materials as these included in the gate cut feature 211. The same as the gate cut feature 211, the dummy gate cut feature 211' may include one or more layers. In the present embodiments, the dummy gate cut feature 211' includes a lining layer 201' and a filling layer 213'. The lining layer 201' and the filling layer 213' are formed in the same processes that the lining layer 201 and the filling layer 213 are formed in. The filling layer 213' has the same size as the filling layer 213. A top surface and a bottom surface of the filling layer 213' are coplanar with a top surface and a bottom surface of the filling layer 213, respectively.

At operation 112, referring to FIGS. 7A, 7B, 8A and 8B, the method 100 forms the dielectric helmets 214 over the gate cut feature 211 and the dummy gate cut feature 211'. The dielectric helmet over the gate cut feature 211 is denoted as 214A and the dielectric helmet over the dummy gate cut feature 211' is denoted as 214B for easier reference and does not indicate the differences therebetween except what explicitly stated in the disclosure. As depicted in FIGS. 7A and 7B, the method 100 first recesses top portions of the gate cut feature 211 and the dummy gate cut feature 211' in an etching process 702 to form trenches 212. The etching process 702 may include any suitable process, such as a dry etching process, a wet etching process, an RIE process, other suitable processes, or combinations thereof.

Referring to FIGS. 8A and 8B, the method 100 fills the trenches 212 with the dielectric helmet 214 (including 214A and 214B) in process 802. The dielectric helmets 214 are oriented lengthwise parallel to the lengthwise direction of the fins 204 and are separated from the sidewalls of the fins 204 by the cladding layer 209. In the present embodiments, the dielectric helmets 214 have an etching selectivity with respect to the gate cut feature 211, the dummy gate cut feature 211', and the cladding layer 209. In the present embodiments, at least a portion of the dielectric helmets 214 (e.g., the dielectric helmet 214A) is configured to provide isolation for a subsequently-formed metal gate stack over the fins 204. In other words, at least a portion of the dielectric helmets 214 is configured to truncate (or cut, separate) the metal gate stack into multiple portions.

In some embodiments, the dielectric helmets 214 include silicon nitride (SiN), silicon carbide (SiC), oxygen-containing silicon nitride (SiON), oxygen-containing silicon carbide (SiOC), carbon-containing silicon nitride (SiCN), aluminum oxide ($Al_2O_3$), tetraethylorthosilicate (TEOS), doped silicon oxide (e.g., borophosphosilicate glass (BPSG), FSG, phosphosilicate glass (PSG), boron-doped silicate glass (BSG), etc.), a high-k dielectric material (having a k value greater than that of silicon oxide, which is about 3.9), other suitable materials, or combinations thereof. The high-k dielectric material may include oxygen, lanthanum, aluminum, titanium, zirconium, tantalum, other suitable materials, or combinations thereof. For example, the high-k dielectric material may include hafnium oxide ($HfO_2$), lanthanum oxide ($La_2O_3$), other high-k oxide materials, or combinations thereof. The dielectric helmets 214 can be single layered or multi-layered. In the present embodiments, the dielectric helmets 214 are each a single layer structure with uniform composition.

At operation 114, referring to FIGS. 9A, 9B, and 9C, the method 100 forms one or more dummy gate stacks 220 over channel regions of the fins 204, the dielectric helmets 214, and the cladding layer 209. Each dummy gate stack 220 may include a dummy gate electrode (not depicted separately)

disposed over an optional dummy gate dielectric layer and/or an interfacial layer. In the present embodiments, the dummy gate stacks 220 are later replaced with metal gate stacks, which are truncated (or cut) by the gate cut feature 211 and/or the dielectric helmets 214. The dummy gate stacks 220 may be formed by a series of deposition and patterning processes. For example, the dummy gate stacks 220 may be formed by depositing a polysilicon (poly-Si) layer over the substrate 202, and subsequently patterning the poly-Si layer via a series of photolithography and etching processes. To accommodate the patterning process and protect the dummy gate stacks 220 during subsequent fabrication processes, a hard mask layer (not depicted) may be formed over the dummy gate stacks 220.

The method 100 may form top gate spacers (not shown) over sidewalls of the dummy gate stack 220. The top gate spacers may be a single-layer structure or a multi-layer structure and may include silicon oxide, SiN, SiC, SiON, SiOC, SiCN, air, a low-k dielectric material, a high-k dielectric material (e.g., hafnium oxide ($HfO_2$), lanthanum oxide ($La_2O_3$), etc.), other suitable materials, or combinations thereof. The top gate spacers may be formed by first depositing a dielectric layer over the dummy gate stacks 220 via a suitable deposition method (e.g., CVD and/or ALD) and subsequently removing portions of the dielectric layer in an anisotropic (e.g., directional) etching process (e.g., a dry etching process), leaving the top gate spacers on the sidewalls of the dummy gate stacks 220.

The method 100 then removes portions of the hard mask 207 and the oxide layer 210 in S/D regions of the fins 204 to expose the topmost channel layer 206, while the portions of the hard mask 207 and the oxide layer 210 under the dummy gate stacks 220 remain intact. In some embodiments, the removing of the hard mask 207 utilizes an etching process including a dry etching process, an RIE process, or combinations thereof.

The method 100 subsequently forms S/D recesses (not shown) in the fins 204 adjacent to the dummy gate stacks 220. In the present embodiments, the method 100 implements an etching process that selectively removes portions of the fins 204 in the S/D regions without removing, or substantially removing, the dummy gate stacks 220, the dielectric helmets 214, and the cladding layer 209. In some embodiments, the etching process is a dry or wet etching process employing a suitable etchant capable of removing Si (i.e., the channel layers 206) and SiGe (i.e., the non-channel layers 205) of the ML. In some non-limiting examples, a dry etchant may be a chlorine-containing etchant including $Cl_2$, $SiCl_4$, $BCl_3$, other chlorine-containing gas, or combinations thereof. A cleaning process may subsequently be performed to clean the S/D recesses with a hydrofluoric acid (HF) solution or other suitable solution.

The method 100 then recesses the cladding layer 209 in the S/D recesses, such that top surfaces of the cladding layer is below the top surfaces of the gate cut feature 211. Remaining portions of the cladding layer in the S/D recesses serve as spacers for forming the S/D features in subsequent processes. In the present embodiments, the remaining portions of the cladding layer 209 may be L shaped and are disposed along sidewalls and bottom surfaces of the gate cut feature 211. Alternatively, the remaining portions of the cladding layer 209 may be U shaped and wrapping around a bottom portion of the dummy gate cut feature 211'. In some embodiments, the portions of the cladding layer 209 is removed by an etching process including a dry etching process, an RIE process, or combinations thereof.

Thereafter, the method 100 forms inner gate spacers (not shown) on sidewalls of the non-channel layers 205 that are exposed in the S/D recesses. The inner gate spacers may be a single-layer structure or a multi-layer structure and may include silicon oxide, SiN, SiCN, SiOC, SiON, SiOCN, a low-k dielectric material, air, a high-k dielectric material, hafnium oxide ($HfO_2$), lanthanum oxide ($La_2O_3$), other suitable dielectric material, or combination thereof. In some embodiments, the inner gate spacers have a composition different from that of the top gate spacers. Forming the inner gate spacers includes performing a series of etching and deposition processes. For example, forming the inner gate spacers may begin with selectively removing portions of the non-channel layers 205 without removing, or substantially removing, portions of the channel layers 206 to form trenches (not depicted). The non-channel layers 205 may be etched by a dry etching process. Subsequently, one or more dielectric layers are deposited in the trenches by any suitable method, such as ALD, CVD, PVD, other suitable methods, or combinations thereof, followed by one or more etching processes to remove (i.e., etch back) excess dielectric layer(s) deposited on surfaces of the channel layers 206 that are exposed in the S/D recesses, thereby forming the inner gate spacers.

At operation 116, referring to FIGS. 10A, 10B, and 10C, the method 100 forms S/D features 224 in each of the S/D recesses. The S/D features 224 may be suitable for forming a p-type FET device (i.e., including a p-type epitaxial material) or, alternatively, an n-type FET device (i.e., including an n-type epitaxial material). The p-type epitaxial material may include one or more epitaxial layers of silicon germanium (epi SiGe) each doped with a p-type dopant such as boron, germanium, indium, gallium, other p-type dopants, or combinations thereof. The n-type epitaxial material may include one or more epitaxial layers of silicon (epi Si) or silicon carbon (epi SiC) each doped with an n-type dopant such as arsenic, phosphorus, other n-type dopants, or combinations thereof. In some embodiments, one or more epitaxy growth processes are performed to grow an epitaxial material in each S/D recess and over the inner gate spacers. For example, the method 100 may implement an epitaxy growth process similar to that discussed above with respect to forming the ML. In some embodiments, the epitaxial material is doped in-situ by adding a dopant to a source material during the epitaxial growth process. In some embodiments, the epitaxial material is doped by an ion implantation process after performing the deposition process. In some embodiments, an annealing process is subsequently performed to activate the dopants in the S/D features 224.

Subsequently, still referring to FIGS. 10A, 10B, and 10C, the method 100 forms an ILD layer 242 over the device 200, thereby filling the space between adjacent dummy gate stacks 220. The ILD layer 242 may include silicon oxide, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. The method 100 subsequently performs one or more CMP process to expose top surfaces of the dummy gate stacks 220.

The method 100 may also form a contact etch-stop layer (CESL) (not shown) over the device 200 prior to the forming of the ILD layer 242 to protect the underlying components, such as the S/D features 224, during subsequent fabrication processes. The CESL may include any suitable dielectric material, such as SiN, SiCN, other suitable materials, or combinations thereof, and may be formed by CVD, ALD, physical vapor deposition (PVD), other suitable methods, or combinations thereof. In the present embodiments, the CESL provides etching selectivity with respect to its surrounding dielectric components to ensure protection against inadvertent damage to these components.

Figure 11A:
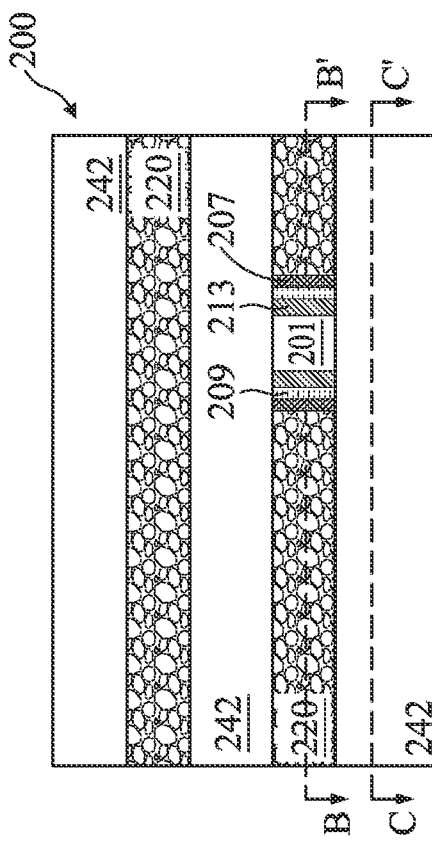
Figure 11C:
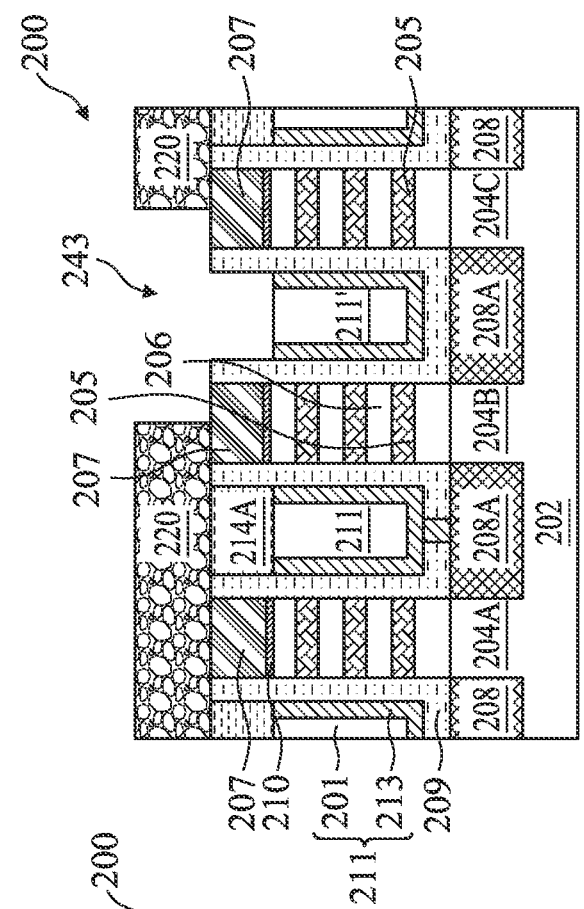
Figure 11B:
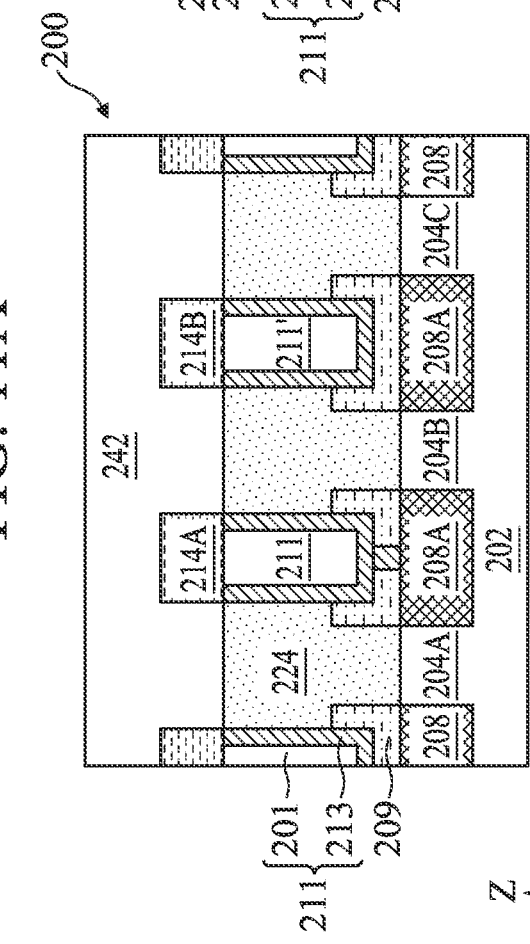
Figure 12A:
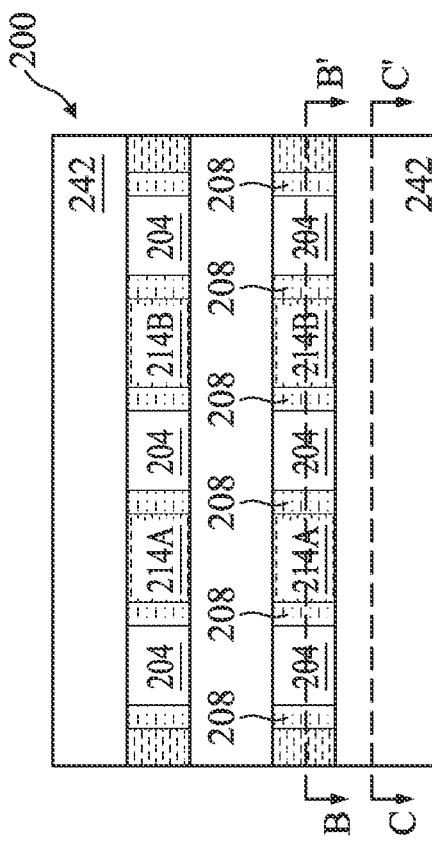
Figure 12C:
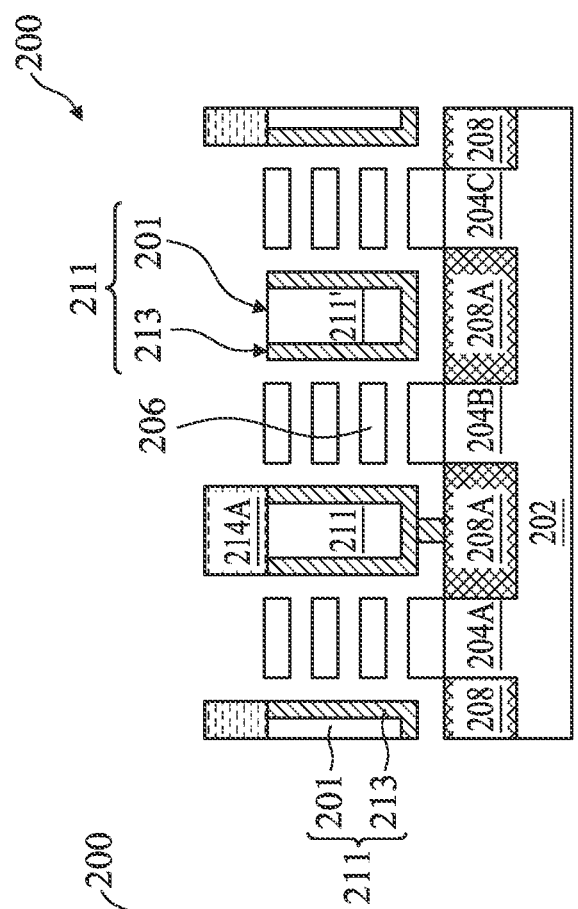
Figure 12B:
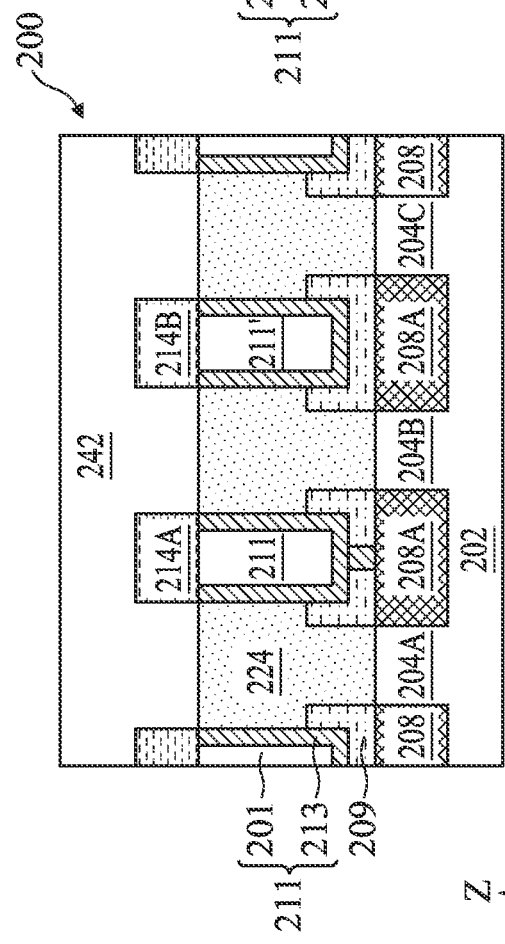

At operation 118, referring to FIGS. 11A, 11B, and 11C, the method 100 removes portions of the dielectric helmets 214 in a patterning process. Remaining portions of the dielectric helmets serve as extensions of the gate cut feature 211 to truncate (or separate, cut) top portions of the metal gate stack. The patterning of the dielectric helmets 214 includes a photolithography process to remove a portion of the dummy gate stack 220 to form an opening 243, thereby exposing the dielectric helmet 214B to be removed. It is noted that the dielectric helmet 214B may have a dimension smaller than the line width limit of the photolithography process. In this regard, the opening 243 is wider than the dielectric helmet 214B to accommodate the dimension of the dielectric helmet 214B. The dielectric helmets 214 may be removed in a wet etching, a dry etching, or a combination thereof. Remaining portions of the dummy gate stacks 220 are used as a mask in the etching processes.

Figure 13A:
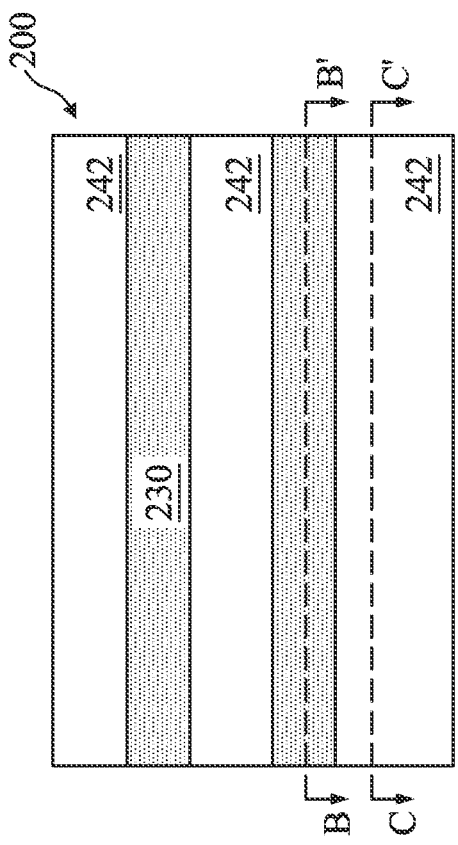
Figure 13B:
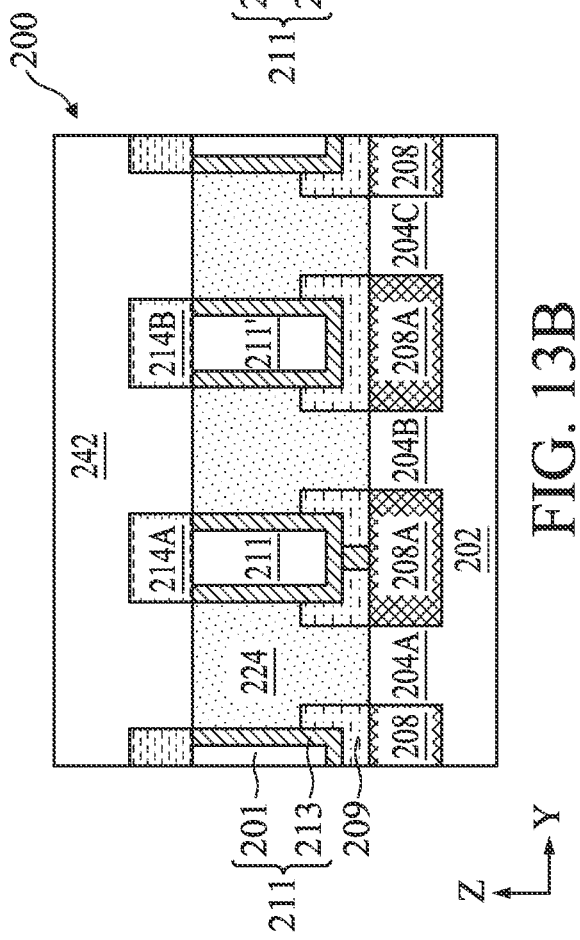
Figure 13C:
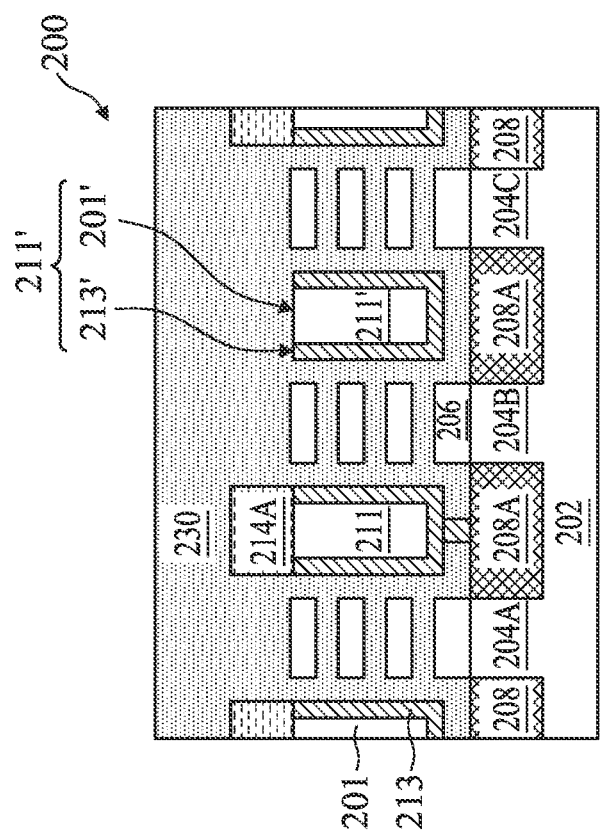

At operation 120, referring to FIGS. 12A to 13C, the method 100 replaces the dummy gate stacks 220, the cladding layer 209 under the dummy gate stack 220, and the non-channel layers 205 with metal gate stacks 230, where the metal gate stacks 230 are separated by the gate cut feature 211 and the dielectric helmet 214A. Prior to the operation 120, the remaining hard mask 207 and the oxide layer 210 are removed in one or more etching processes. The method 100 then removes the remaining portions of the dummy gate stacks 220 to form gate trenches; removes the cladding layer 209 exposed therein; and removes the non-channel layers 205 from the ML to form openings between the channel layers 206, as depicted in FIG. 12C. The method 100 subsequently forms metal gate stacks 230 in the gate trenches and the openings, such that each metal gate stack 230 wraps around (or is interleaved with) each channel layer 206 as depicted in FIGS. 13A to 13C.

In the present embodiments, the metal gate stack 230 includes a gate dielectric layer (not depicted separately) and a metal gate electrode (not depicted separately) over the gate dielectric layer. The gate dielectric layer may include a high-k dielectric material, such as $HfO_2$, $La_2O_3$, other suitable materials, or combinations thereof. The metal gate electrode includes at least one work function metal layer and a bulk conductive layer disposed thereover. The work function metal layer may be a p-type or an n-type work function metal layer. Example work function metals include TiN, TaN, WN, $ZrSi_2$, $MoSi_2$, $TaSi_2$, $NiSi_2$, Ti, TaAl, TaAlC, TiAlN, TaC, TaCN, TaSiN, Mn, Zr, other suitable work function metals, or combinations thereof. The bulk conductive layer may include Cu, W, Al, Co, Ru, other suitable materials, or combinations thereof. The metal gate stack 230 may further include other material layers (not depicted), such as an interfacial layer disposed on surfaces of the channel layers 206, a capping layer, a barrier layer, other suitable layers, or combinations thereof. Various layers of the metal gate stack 230 may be formed by various methods, including ALD, CVD, PVD, plating, other suitable methods, or combinations thereof. After forming the bulk conductive layer, one or more CMP processes are performed to remove excessive material formed on top surface of the ILD layer 242, thereby planarizing the device 200.

Figure 14A:
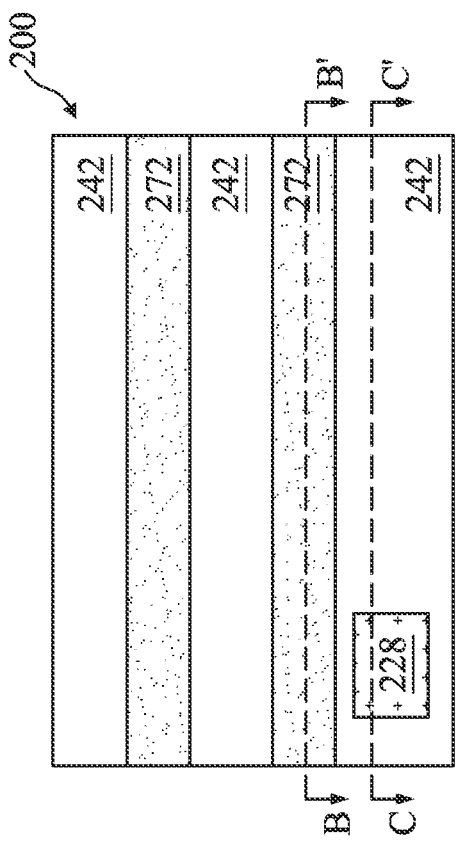
Figure 14C:
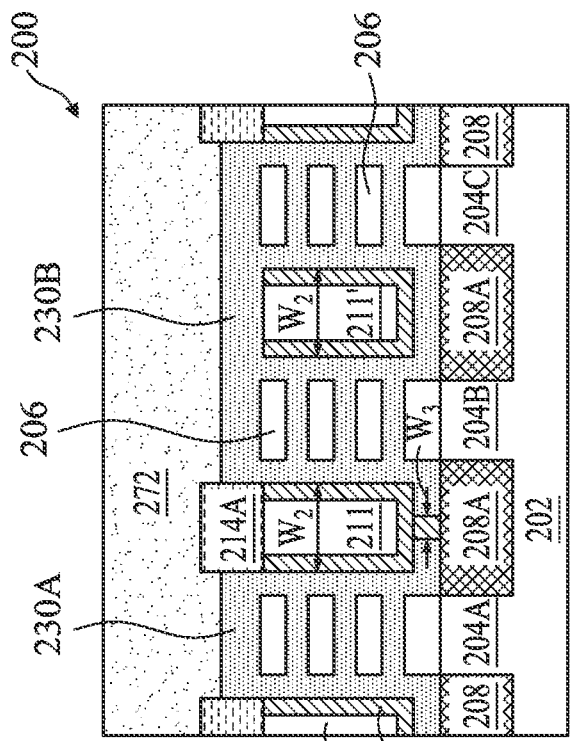
Figure 14B:
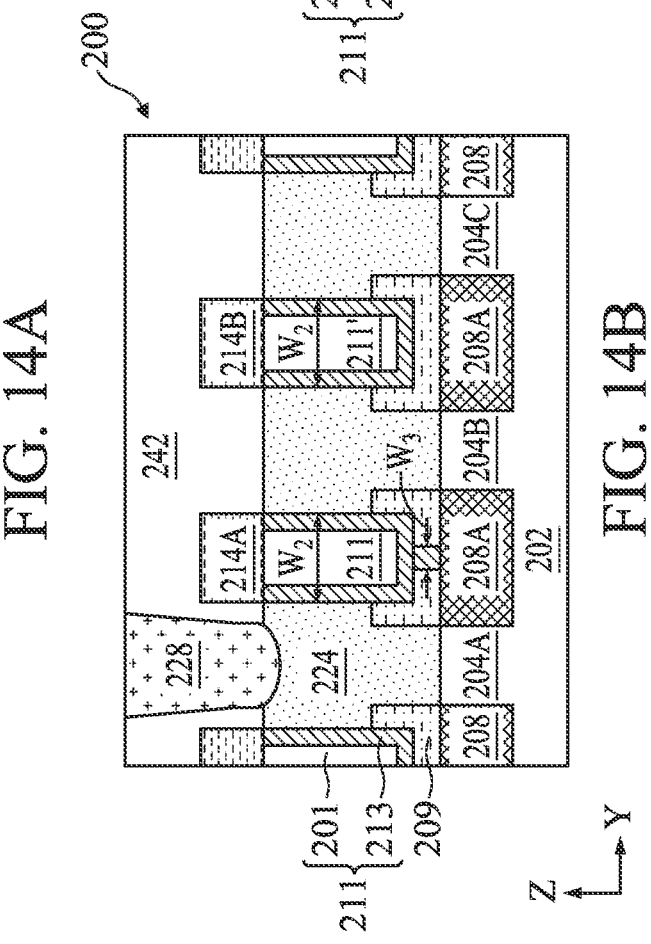
Figures 1, 14C:
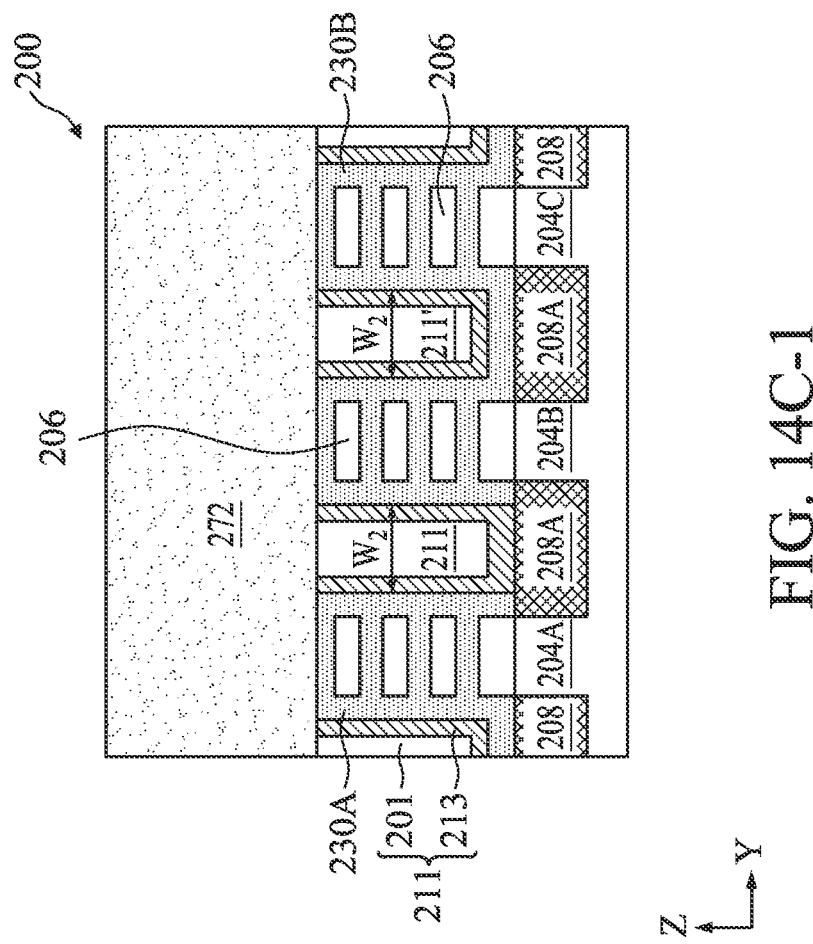

Thereafter, referring to FIG. 14A to 14C, the method 100 recesses the metal gate stack 230, such that a top surface of the recessed metal gate stack 230 is below a top surface of the dielectric helmet 214A. The dielectric helmets 214A, together with the gate cut feature 211, truncates (or separate) the recessed metal gate stacks 230 into metal gate stack 230A and 230B as depicted in FIG. 14C. In other words, the metal gate stack 230A is separated from the metal gate stack 230B by the gate cut feature 211 at the bottom and by the dielectric helmet 214 at the top. In some embodiments, the etching process includes any suitable method, such as ALD, CVD, PVD, other suitable methods, or combinations thereof.

The metal gate stack 230B wraps around the dummy gate cut feature 211', where a portion of the metal gate stack 230B spans from the fin 204B to the fin 204C over the dummy gate cut feature 211'. The metal gate stack 230B is continuous under the dummy gate cut feature 211'. The dummy gate cut feature 211' is separated from the isolation feature 208B by the metal gate stack 230B. In other words, the dummy gate cut feature 211' is embedded in the metal gate stack 230B and does not truncate (or cut, separate) the metal gate stack 230B. The portions of the metal gate stack 230B over and under the dummy gate cut feature ensures the connection and reduces resistance of the metal gate stack 230B.

In alternative embodiments, referring to FIGS. 1 and 14C-1, the operations 112 and 118 may be omitted from the method 100 to simplify the fabricating processes. In this case, the forming of the dielectric helmets 214 is omitted. Accordingly, instead of recessing the top surfaces of the metal gate stacks 230 below the dielectric helmets 214 and above the top surface of the gate cut feature 211, the method 100 recesses the top surface of the metal gate stack 230 to be coplanar with the top surface of the gate cut feature 211. As such, the gate cut feature 211 truncates the metal gate stack 230 into metal gate stacks 230A and 230B without the help of the dielectric helmets 214 as depicted in FIG. 14C. It is noted that the gate cut feature 211 depicted in FIG. 14C-1 is defined by the width $w_2$ throughout the entire length along Z direction, similar as the embodiments depicted in FIGS. 5B-1 and 6B-1.

At operation 122, still referring to 14A to 14C, method 100 performs additional processing steps to the device 200. For example, the method 100 forms a dielectric layer 272 over the metal gate stack 230, thereby filling the gate trench. In some embodiments, the dielectric layer 272 is configured to provide etching selectivity during subsequent fabrication processes including, for example, patterning the ILD layer 242 to form S/D contact openings (not shown) over the S/D features 224. Accordingly, the dielectric layer 272 has a composition different from that of the ILD layer 242. In some embodiments, the dielectric layer 272 includes SiN, SiCN, SiOC, SiON, SiOCN, other suitable materials, or combinations thereof. The dielectric layer 272 may be deposited by any suitable method, such as ALD, CVD, PVD, other suitable methods, or combinations thereof. Subsequently, the method 100 removes portions of the dielectric layer 272 formed over the ILD layer 242 in one or more CMP process, thereby planarizing the top surface of the device 200.

The additional processing steps may further include forming an S/D contact 228 over the S/D features 224. The S/D contact 228 may include any suitable conductive material, such as Co, W, Ru, Cu, Al, Ti, Ni, Au, Pt, Pd, and/or other suitable conductive materials. The method 100 may form an S/D contact opening (or trench) in the ILD layer 242 via a series of patterning and etching processes and subsequently deposit a conductive material in the S/D contact opening using any suitable method, such as CVD, ALD, PVD, plating, and/or other suitable processes. In some embodiments, a silicide layer (not depicted) is formed between the S/D features 224 and the S/D contact 228. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the S/D feature 224 by a series of deposition, thermal, and etching processes.

The additional fabrication process 132 to the device 200 may also include forming a multi-layer interconnect (MLI) structure (not depicted) thereover. The MLI may include various interconnect features, such as vias and conductive lines, disposed in dielectric layers, such as ESLs and ILD layers 242. In some embodiments, the vias are vertical interconnect features configured to interconnect a device-level contact, such as the S/D contact 228 or a gate contact (not depicted), with a conductive line, or interconnect different conductive lines, which are horizontal interconnect features. The ESLs and the ILD layers of the MLI may have substantially the same compositions as those discussed above with respect to the ESL described above and the ILD layer 242, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Although not intended to be limiting, one or more embodiments of the present disclosure provide many benefits to a semiconductor device and the formation thereof. For example, the present disclosure provides a method of forming a gate cut feature with high aspect ratio. The gate cut feature is formed prior to the forming of the dummy gate stacks. The gate cut feature is disposed between two fins and connects to the isolation feature through an opening in the cladding layer of the fins. Embodiments of the disclosed methods can be readily integrated into existing processes and technologies for manufacturing NS FETs, FinFETs, and/or other suitable devices.

In one aspect, the present disclosure provides a method. The method includes forming a fin protruding from a substrate, forming a first dielectric feature adjacent to the fin over the substrate, forming a cladding layer over the fin and the first dielectric feature, removing a portion of the cladding layer to form an opening, the opening exposing the first dielectric feature, and forming a second dielectric feature adjacent to the cladding layer, the second dielectric feature filling the opening, forming a dummy gate stack over the fin and the second dielectric feature, forming source/drain (S/D) features in the fin adjacent to the dummy gate stack, and replacing the dummy gate stack and the cladding layer with a metal gate stack, the second dielectric feature dividing the metal gate stack. In some embodiments, the removing of the portion of the cladding layer forms the opening defined by a width that is less than a width of the second dielectric feature. In some embodiments, the removing of the portion of the cladding layer forms the opening defined by a width equals to a width of the second dielectric feature. In some embodiments, the metal gate stack has a top surface coplanar with a top surface of the second dielectric feature. In some embodiments, the method further includes forming a dielectric helmet (214) over the second dielectric feature, the dielectric helmet separating a top portion of the metal gate stack. In some embodiments, the method further includes forming a third dielectric feature disposed on an opposite side of the fin away from the second dielectric feature, the third dielectric feature being disposed over the cladding layer without an opening to expose the first dielectric feature, and the cladding layer under the third dielectric feature is replaced by the metal gate stack without being separated by the third dielectric feature. In some embodiments, a portion of the metal gate stack is disposed over the third dielectric feature.

In another aspect, the present disclosure provides a method of forming a semiconductor structure. The method includes forming a first fin and a second fin disposed over a substrate, each of the first and the second fins including alternating channel layers and non-channel layers, forming an isolation feature between the first fin and the second fin over the substrate, forming a cladding layer over the first fin, the second fin, and the isolation feature, forming an opening in the cladding layer over the isolation feature, thereby separating the cladding layer into a first portion over the first fin and a second portion over the second fin, forming a gate cut feature between the first portion and the second portion of the cladding layer, thereby filling the opening, forming a dummy gate stack over the first fin, the second fin, and the gate cut feature, forming source/drain (S/D) features in the first and second fin adjacent to the dummy gate stack, and replacing the dummy gate stack, the cladding layer, and the non-channel layers with a metal gate stack. The gate cut feature truncates the metal gate stack into two portions disposed on opposite sides of the gate cut feature. In some embodiments, the forming of the opening in the cladding layer removes an entire horizontal portion of the cladding layer between the first and the second fin. In some embodiments, the forming of the opening in the cladding layer removes a portion of a horizontal portion of the cladding layer between the first and the second fin. In some embodiments, the isolation feature includes a material that is the same as a material included in the gate cut feature. In some embodiments, the metal gate stack has a top surface coplanar with a top surface of the gate cut feature. In some embodiments, the method further includes forming a dielectric helmet over the gate cut feature, the dielectric helmet cutting the metal gate stack into two portions disposed on opposite sides of the dielectric helmet. In some embodiments, the method further includes forming a third fin disposed over the substrate, the first fin and the third fin being disposed on opposite sides of the second fin, and forming a dummy gate cut feature between the second and the third fin, a third portion of the cladding layer over the third fin being connect to the second portion of the cladding layer, and the metal gate stack under the dummy gate cut feature being continuous. In some embodiments, a portion of the metal gate stack spans across the second fin, the dummy gate cut feature, and the third fin.

In yet another aspect, the present disclosure provides a semiconductor structure. The semiconductor structure includes a first and a second semiconductor fin each including a stack of semiconductor layers and disposed over a substrate, an isolation feature between the first and the second semiconductor fin and disposed over the substrate, a gate stack interposed with the first and the second semiconductor fin and disposed over the isolation feature, and a gate cut feature separating the gate stack into a first portion over the first semiconductor fin and a second portion over the second semiconductor fin, wherein a bottom surface of the gate cut feature contacts the isolation feature through a hole in the gate stack. In some embodiments, the semiconductor structure further includes a third semiconductor fin disposed next to the second semiconductor fin in a direction away from the first semiconductor fin, and a dummy gate cut feature disposed between the second semiconductor fin and the third semiconductor fin, the dummy gate cut feature being separated from the isolation feature by the gate stack. In some embodiments, a first portion of the gate stack over the first semiconductor fin is separated from a second portion of the gate stack over the second semiconductor fin; and a third portion of the gate stack over the third semiconductor fin contacts the second portion. In some embodiments, a top surface of the gate stack is coplanar with a top surface of the gate cut feature. In some embodiments, the semiconductor structure further includes a dielectric helmet over the gate cut feature, wherein the dielectric helmet is disposed between the first portion and the second portion of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin protruding from a substrate;
    forming a first dielectric feature adjacent to the fin over the substrate;
    forming a cladding layer over the fin and the first dielectric feature;
    removing a portion of the cladding layer to form an opening, wherein the opening exposes the first dielectric feature; and
    forming a second dielectric feature adjacent to the cladding layer, wherein the second dielectric feature fills the opening;
    forming a dummy gate stack over the fin and the second dielectric feature;
    forming source/drain (S/D) features in S/D regions of the fin not covered by the dummy gate stack;
    removing the dummy gate stack to form a gate trench, the gate trench exposing the cladding layer;
    removing the cladding layer; and
    forming a metal gate stack in the gate trench, wherein the second dielectric feature divides the metal gate stack.

2. The method of claim 1, wherein the removing of the portion of the cladding layer forms the opening defined by a width that is less than a width of the second dielectric feature.

3. The method of claim 1, wherein the removing of the portion of the cladding layer forms the opening defined by a width equals to a width of the second dielectric feature.

4. The method of claim 1, wherein the metal gate stack has a top surface coplanar with a top surface of the second dielectric feature.

5. The method of claim 1, further comprising:
    forming a dielectric helmet (214) over the second dielectric feature, wherein the dielectric helmet separates a top portion of the metal gate stack.

6. The method of claim 1, further comprising:
    forming a third dielectric feature disposed on an opposite side of the fin away from the second dielectric feature, wherein the third dielectric feature is disposed over the cladding layer without an opening to expose the first dielectric feature, and wherein the cladding layer under the third dielectric feature is replaced by the metal gate stack without being separated by the third dielectric feature.

7. The method of claim 6, wherein a portion of the metal gate stack is disposed over the third dielectric feature.

8. A method of forming a semiconductor structure, comprising:
    forming a first fin and a second fin disposed over a substrate, wherein each of the first and the second fins includes alternating channel layers and non-channel layers;
    forming an isolation feature between the first fin and the second fin over the substrate;
    forming a cladding layer over the first fin, the second fin, and the isolation feature;
    forming an opening in the cladding layer over the isolation feature, thereby separating the cladding layer into a first portion over the first fin and a second portion over the second fin;
    forming a gate cut feature between the first portion and the second portion of the cladding layer, thereby filling the opening;
    forming a dummy gate stack over the first fin, the second fin, and the gate cut feature;
    forming source/drain (S/D) features in regions of the first and second fins not covered the dummy gate stack;
    removing the dummy gate stack to form a gate trench, the gate trench exposing the cladding layer;
    removing the cladding layer to expose sidewalls of the non-channel layers in the gate trench;
    removing the non-channel layers; and
    forming a metal gate stack in the gate trench, wherein the gate cut feature truncates the metal gate stack into two portions disposed on opposite sides of the gate cut feature.

9. The method of claim 8, wherein the forming of the opening in the cladding layer removes an entire horizontal portion of the cladding layer between the first and the second fin.

10. The method of claim 8, wherein the forming of the opening in the cladding layer removes a portion of a horizontal portion of the cladding layer between the first and the second fin.

11. The method of claim 8, wherein the isolation feature includes a material that is the same as a material included in the gate cut feature.

12. The method of claim 8, wherein the metal gate stack has a top surface coplanar with a top surface of the gate cut feature.

13. The method of claim 8, further comprising:
    forming a dielectric helmet over the gate cut feature, wherein the dielectric helmet cuts the metal gate stack into two portions disposed on opposite sides of the dielectric helmet.

14. The method of claim 8, further comprising:
    forming a third fin disposed over the substrate, wherein the first fin and the third fin are disposed on opposite sides of the second fin; and
    forming a dummy gate cut feature between the second and the third fin, wherein a third portion of the cladding layer over the third fin is connect to the second portion of the cladding layer, and wherein the metal gate stack under the dummy gate cut feature is continuous.

15. The method of claim 14, wherein a portion of the metal gate stack spans across the second fin, the dummy gate cut feature, and the third fin.

16. A method, comprising:
  forming a fin over a substrate, the fin including alternating channel layers and sacrificial layers;
  depositing an isolation feature on sidewalls of the fin;
  forming a cladding layer over the sidewalls of the fin and a top surface of the isolation feature;
  forming an isolation structure over a horizontal portion of the cladding layer, wherein the fin and the isolation structure sandwich a vertical portion of the cladding layer, wherein a top surface of the vertical portion of the cladding layer is not covered by the isolation structure;
  removing the vertical portion and the horizontal portion of the cladding layer to form a trench, the trench exposing sidewalls of the sacrificial layers, a bottom portion of the trench extending to a position directly under the isolation structure;
  removing the sacrificial layers; and
  forming a metal gate structure in the trench, the metal gate structure wrapping around each of the channel layers, wherein a portion of the metal gate structure filling the bottom portion of the trench is directly under the isolation structure.

17. The method of claim 16, wherein, in a cross section perpendicular to a lengthwise direction of the channel layers, the metal gate structure fully surrounds the isolation structure.

18. The method of claim 16, further comprising:
  forming an opening in the horizontal portion of the cladding layer, wherein the isolation structure extends downwardly through the opening and has a physical contact with the top surface of the isolation feature.

19. The method of claim 18, further comprising:
  recessing the metal gate structure, such that a top surface of the metal gate structure is lower than a top surface of the isolation structure.

20. The method of claim 16, further comprising:
  forming a dummy gate stack over the fin and the isolation structure;
  patterning the dummy gate stack to form an opening directly above the isolation structure;
  recessing the isolation structure through the opening; and
  removing the dummy gate stack.

* * * * *